United States Patent [19]

Halim et al.

[11] Patent Number: 4,972,436
[45] Date of Patent: Nov. 20, 1990

[54] HIGH PERFORMANCE SIGMA DELTA BASED ANALOG MODEM FRONT END

[75] Inventors: Raouf Y. Halim, Alpharetta; Randy D. Nash, Dacula, both of Ga.

[73] Assignee: Hayes Microcomputer Products, Inc., Norcross, Ga.

[21] Appl. No.: 257,733

[22] Filed: Oct. 14, 1988

[51] Int. Cl.$^5$ ............................................. H04B 14/06
[52] U.S. Cl. .......................................... 375/28; 341/143;
364/724.1; 375/8; 370/32.1
[58] Field of Search ................ 364/724.1, 724.03;
328/151; 307/353, 248–583; 341/143, 122, 155,
144; 375/25, 28

[56] References Cited

U.S. PATENT DOCUMENTS

| | | | |
|---|---|---|---|
| 4,439,756 | 3/1984 | Shenoi et al. | 341/143 |
| 4,504,802 | 3/1985 | Heatherington | 332/18 |
| 4,528,551 | 7/1985 | Agrawal et al. | 341/155 |
| 4,549,302 | 10/1985 | Heatherington | 375/8 |
| 4,593,271 | 6/1986 | Candy | 341/144 |
| 4,775,851 | 10/1988 | Borth | 341/155 |
| 4,851,841 | 7/1989 | Sooch | 375/28 X |

OTHER PUBLICATIONS

Candy, *A Use of Double Integration in Sigma Delta Modulation*, IEEE Trans. Comm., vol. Com–33, No. 3, Mar. 1985, pp. 249–258.
Lee et al., *Low-Distortion Switched—Capacitor Filter Design Techniques*, IEEE J. Solid-State Circuits, vol. SC-20, No. 6, Dec. 1985, pp. 1103-1113.
Inose et al., *A Telemetering System by Code Modulation-Δ-ΣModulation*, IRE Trans. On Space Electronics and Telemetry, Sep. 1962, pp. 204–209.
Candy et al., *A Voiceband Codec with Digital Filtering*, IEEE Trans. Comm., vol. Com–29, No. 6, Jun. 1981, pp. 815–830.
Defraeye et al., *A 3-μm CMOS Digital Codec With Programmable Echo Cancellation and Gain Setting*, IEEE J. Solid—State Circuits, vol. SC-20, No. 3, Jun. 1985, pp. 679-687.

AT&T Data Sheet—Preliminary—T7512 Dual PCM Codec with Filters, Jun. 1987.
CS5316, Delta–Sigma CMOS Analog to Digital Converter, Crystal Semiconductor Corporation, Aug. 1986.
Candy et al., *Double Interpolation for Digital-to-Analog Conversion*, IEEE Trans. Comm., vol. Com-34, No. 1, Jan. 1986, pp. 77–81.
Misawa et al., *Single-Chip per Channel Codec with Filters Utilizing Δ-Σ Modulation*, IEEE J. Solid–State Circuits, vol. SC-16, No. 4, Aug. 1981, pp. 333-341.

(List continued on next page.)

*Primary Examiner*—Benedict V. Safourek
*Assistant Examiner*—Tesfaldet Bocure
*Attorney, Agent, or Firm*—Jones, Askew & Lunsford

[57] ABSTRACT

An improved analog front end circuit for a high performance modem comprising an oversampling sigma delta modulator analog-to-digital converter which employs a novel four phase clocked MOSFET switched capacitor integrator. The integrator is switched in a manner as to eliminate signal dependent charges in the MOSFET switches. The sigma delta modulator shifts quantization noise of the analog-to-digital conversion process out of baseband of the analog signal. A novel integrated decimating FIR low pass filter filters the quantization noise from the digital output signals, and reduces the number of digital signals to obtain a sufficient number of signal samples in order to provide operation at high speeds, for example 9600 bps. The improved four phase switched capacitor integrator is also suitable for use in sigma delta modulator circuits, analog-to-digital converter circuits, integrating cirucits, and the like. A novel return-to-zero circuit eliminates distortion in a sigma delta modulator based analog-to-digital conversion process which can result from unequal rise and fall times of the digital output, by insuring that the energies in signals represented by a "one" and signals represented by a "zero" are equal, even during portions of the bit stream wherein there is a consecutive sequence of "ones".

39 Claims, 13 Drawing Sheets

OTHER PUBLICATIONS

Hauser et al., *Circuit and Technology Considerations for MOS Delta-Sigma A/D Converters*, IEEE 1986 (journal unknown), pp. 1310–1315.

Hauser et al., *MOS ADC-Filter Combination That Does Not Require Precision Analog Components*, IEEE Dig. Int. Solid-State Circuits Conf., 1985, pp. 80–82.

Everard, *A Single-Channel PCM Codec*, IEEE J. Solid-State Circuits, vol. SC-14, No. 1, Feb. 1979, pp. 25–37.

Candy, *Decimation for Sigma Delta Modulation*, IEEE Trans. Comm., vol. Com-34, No. 1, Jan. 1986, pp. 72–76.

Aug. 1983, Proc. IEEE, pp. 915–1009.

Misawa et al., *A Single-Chip CODEC With Filters-Architecture*, IEEE (publication journal unknown), 1980, pp. 30.5.1–30.5.6.

Goodman et al., *Nine Digital Filters for Decimation and Interpolation*, IEEE Trans. Acoust., Speech, Signal Processing, vol. ASSP-25, No. 2, Apr. 1977, pp. 121–126.

Candy et al., *Using Triangularly Weighted Interpolation to Get 13-Bit PCM From a Sigma-Delta Modulator*, IEEE Trans. Comm., Nov. 1976.

Ardalan et al., *An Analysis of Sinusoidally Excited Delta-Sigma Modulators*, IEEE (journal unknown), 1987, pp. 49.9.1–49.9.4.

Ritchie et al., *Interpolative Digital-to-Analog Converters*, IEEE Trans. Comm., vol. Com-22, No. 11, Nov. 1974, pp. 1707–1806.

Fielder et al., *A CMOS Pulse Density Modulator for High-Resolution A/D Converters*, IEEE J. Solid—State Circuits, vol. SC-19, No. 6, Dec. 1984, pp. 995–998.

Tewksbury et al., *Oversampled, Linear Predictive and Noise-Shaping Coders of Order $N>1$*, IEEE Trans. Circuits and Systems, vol. CAS-25, No. 7, Jul. 1978, pp. 436–447.

Adams, *Design and Implementation of an Audio 18-Bit Analog-to-Digital Converter Using Oversampling Techniques*, J. Audio Eng. Soc., vol. 34, No. 3, Mar. 1986.

Candy et al., *A Per-Channel A/D Converter having 15–Segment $\mu$-255 Companding*, IEEE Trans. Comm., vol. Com-24, No. 1, Jan. 1976, pp. 33–42.

Vogel et al., *A Digital Signal-Processing Codec Filter for PCM Applications*, IEEE J. Solid-State Circuits, vol. SC-21, No. 1, Feb. 1986, pp. 175–181.

Candy et al., *The Structure of Quantization Noise from Sigma-Delta Modulation*, IEEE Trans. Comm., vol. Com-29, No. 9, Sep. 1981, pp. 1316–1323.

Inose et al., *A Unity Bit Coding Method by Negative Feedback*, Proc. IEEE, Nov. 1963, pp. 1524–1535.

Agrawal et al., *Specification-Based Design of $\Sigma\Delta M$ for A/D and D/A Conversion*, IEEE 1982 (journal unknown), pp. 1980–1983.

Candy, *A Use of Limit Cycle Oscillations to Obtain Robust Analog-to-Digital Converters*, IEEE Trans. Comm., vol. Com-22, No. 3, Mar. 1974, pp. 298–305.

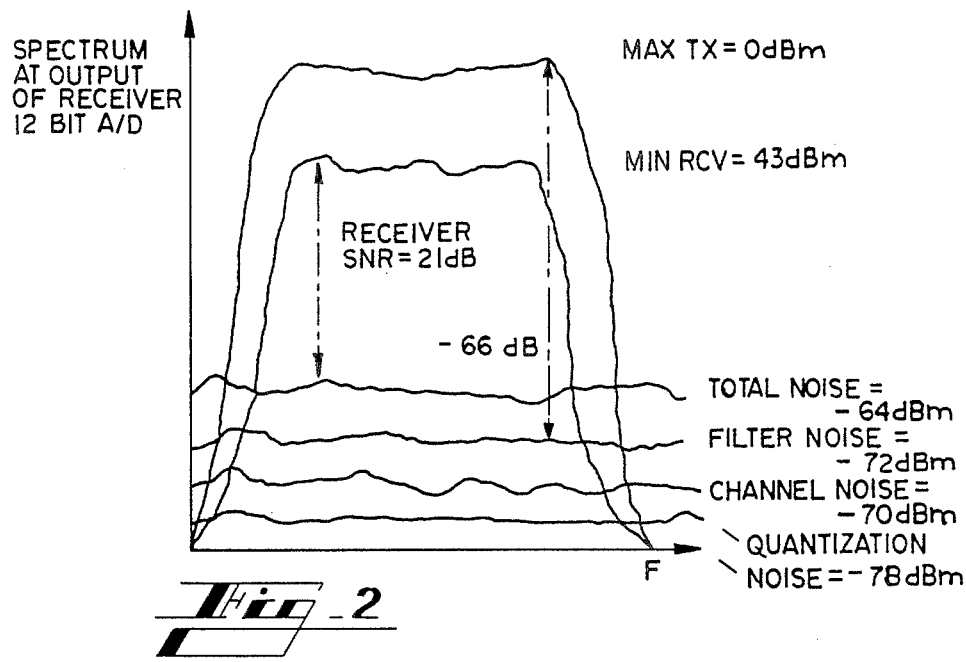
Fig_2
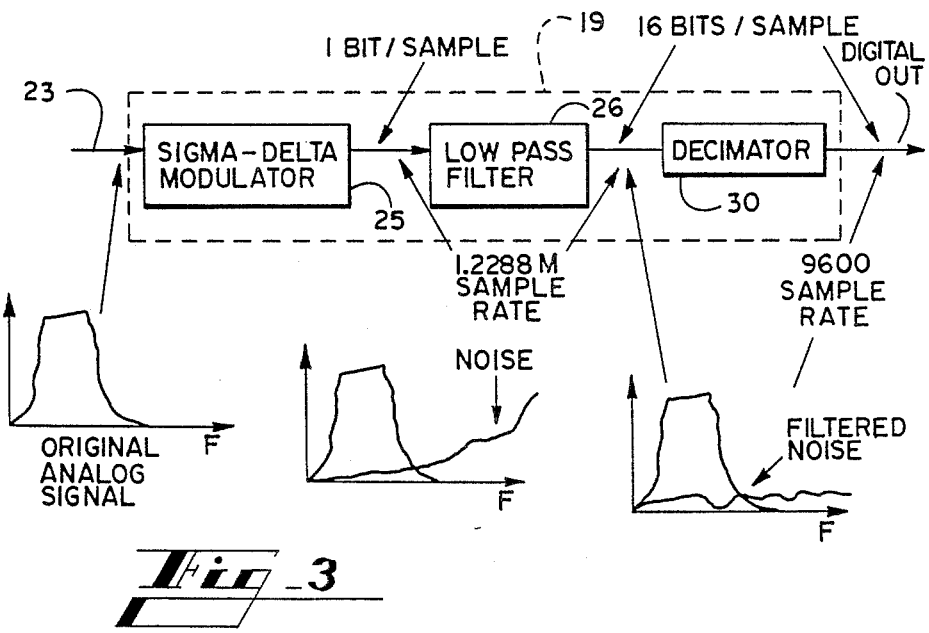
Fig_3

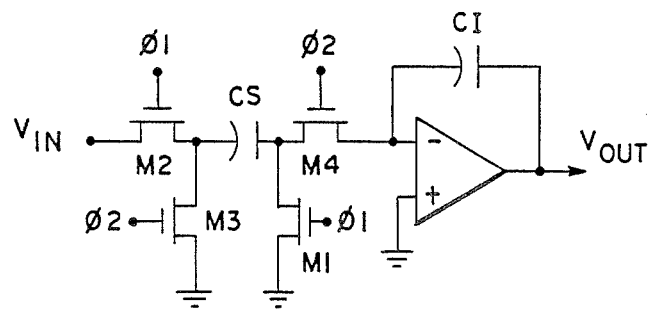
*PRIOR ART*
*Fig_6A*
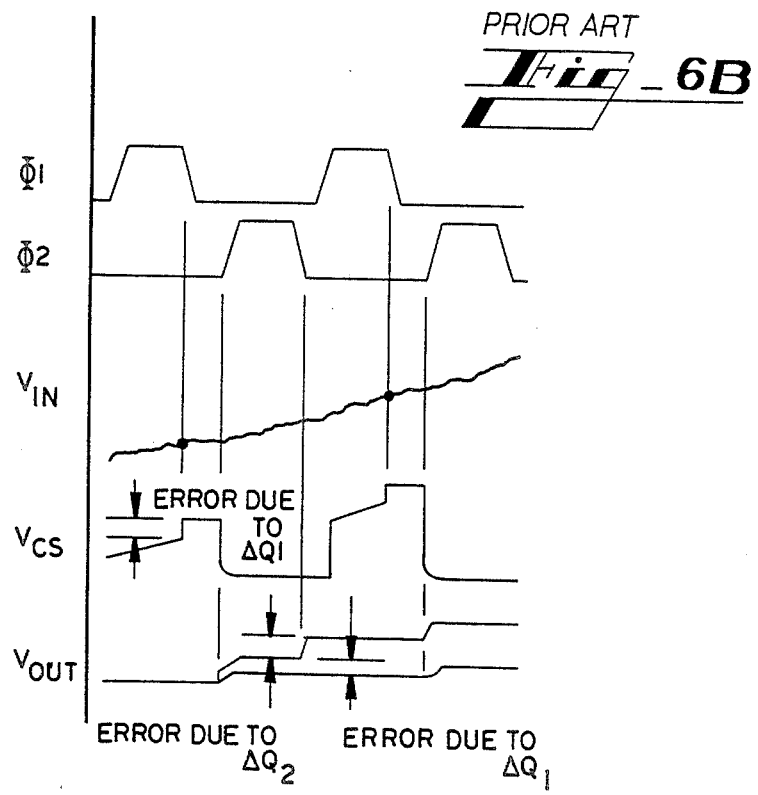
*PRIOR ART*
*Fig_6B*

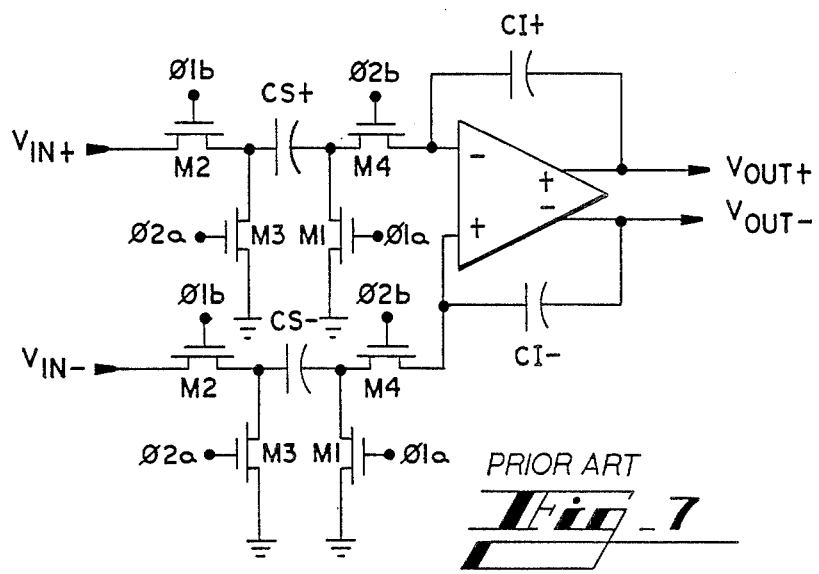
*Fig_7* PRIOR ART
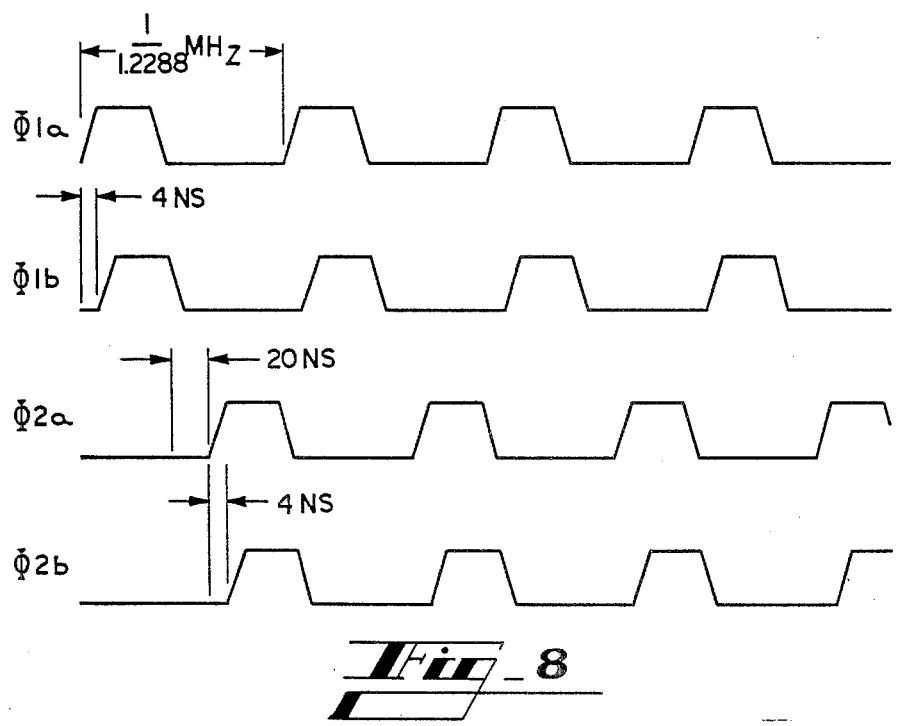
*Fig_8*

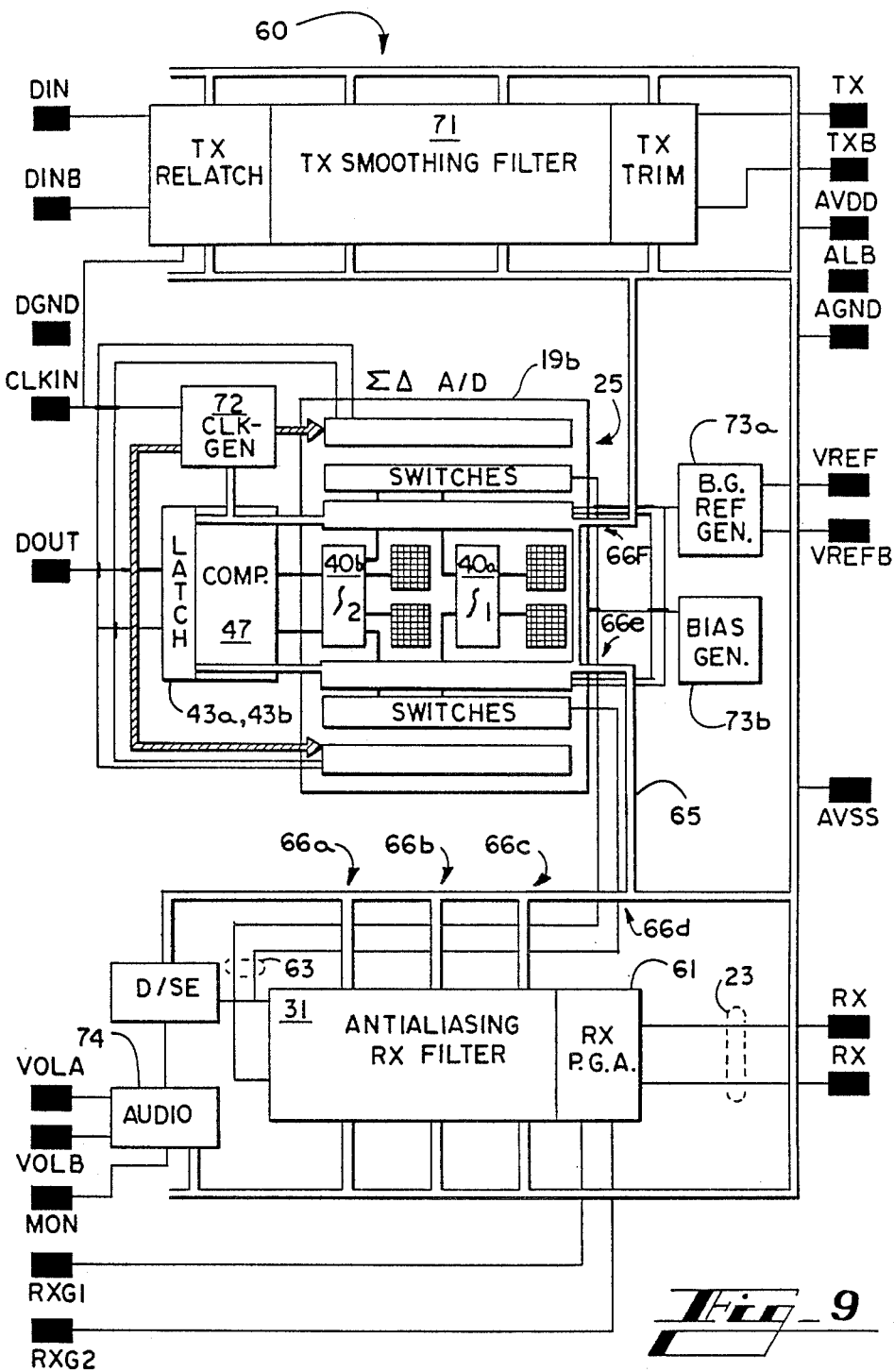
Fig_9

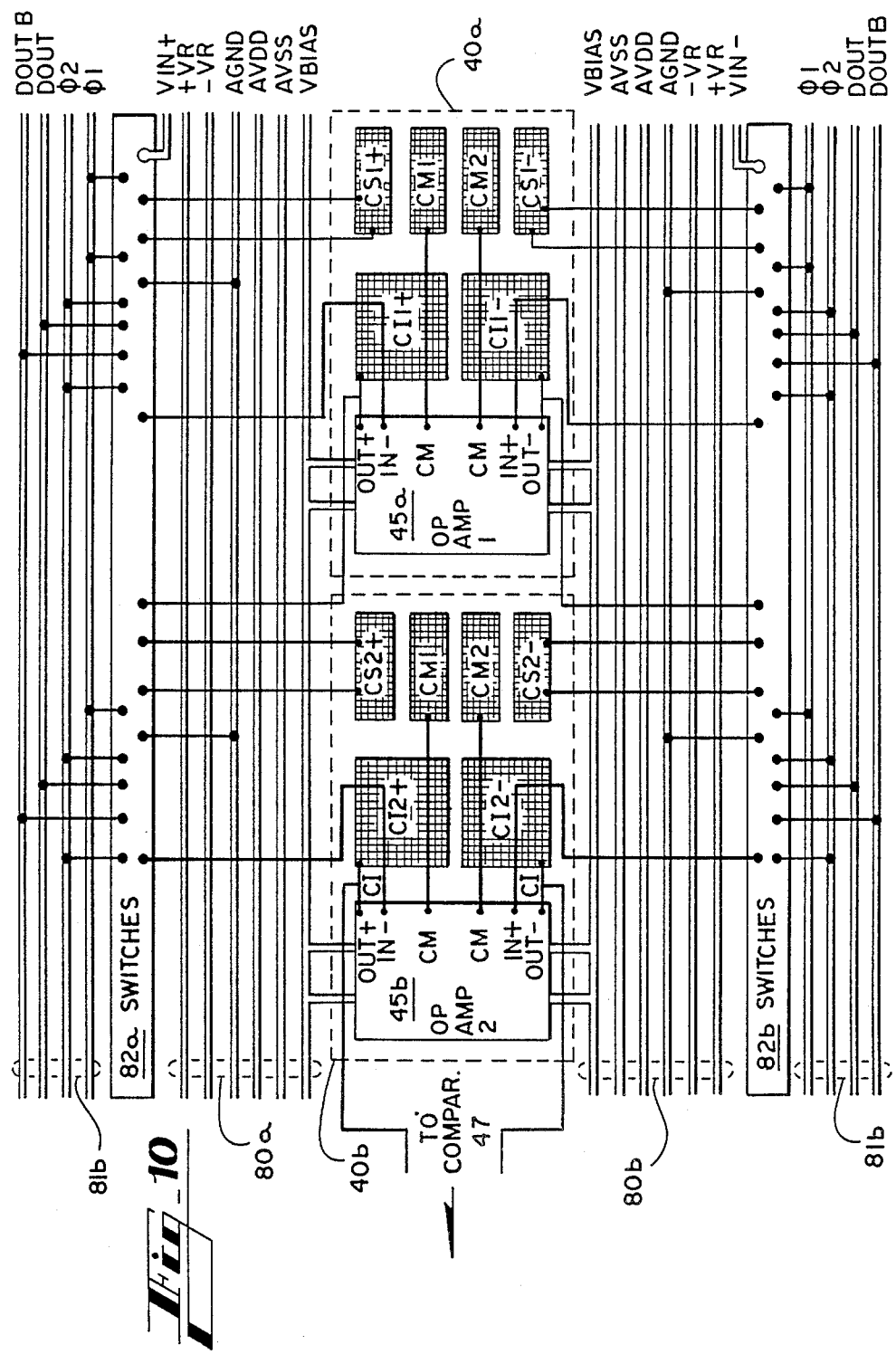

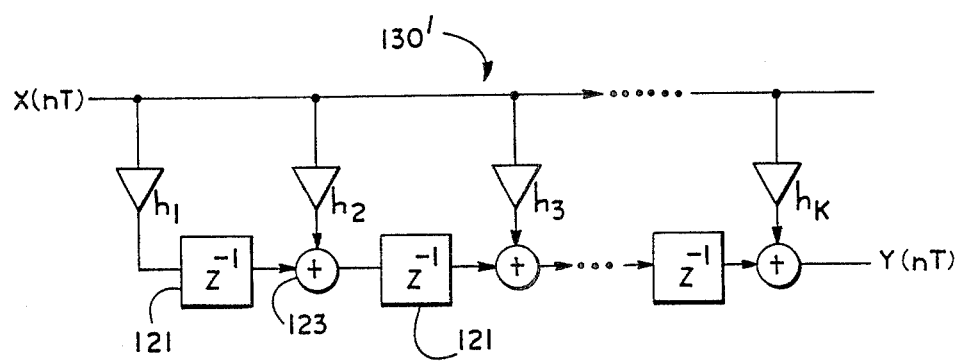
Fig_13
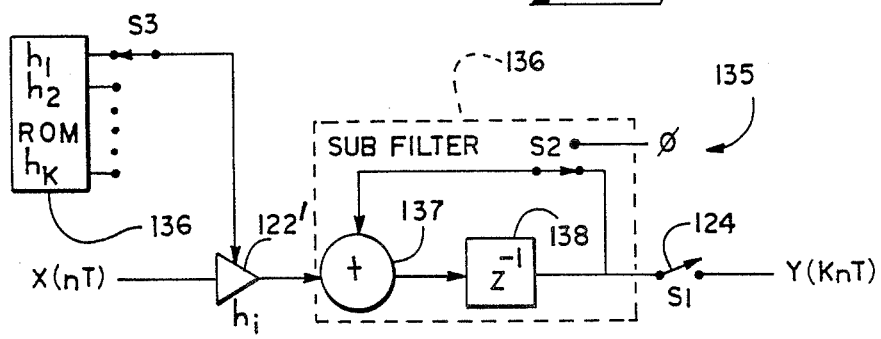
Fig_14
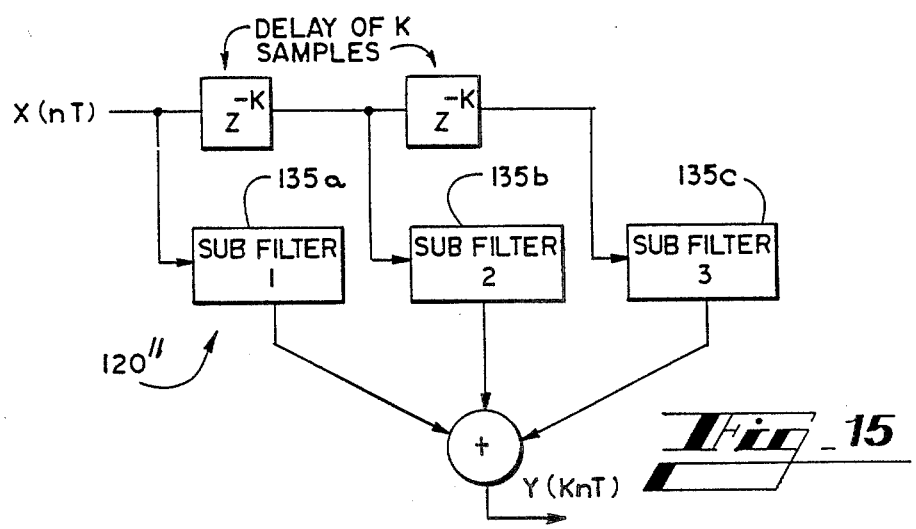
Fig_15

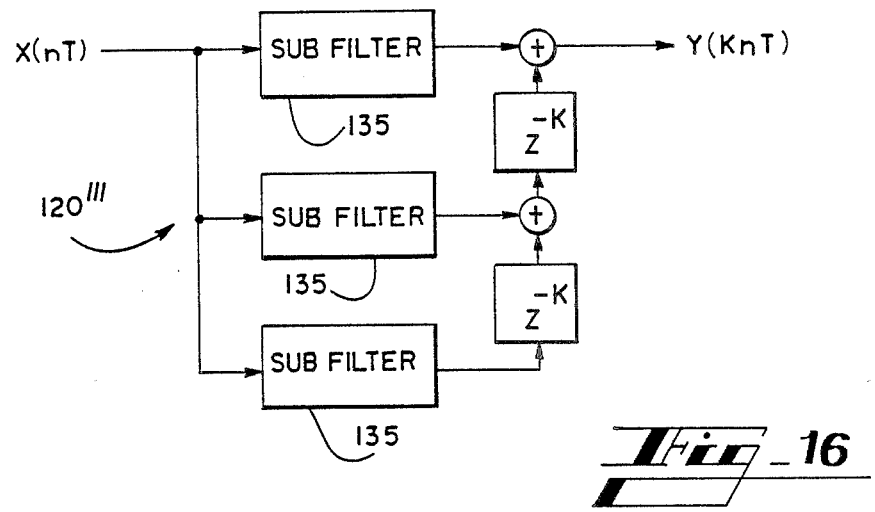
Fig_16
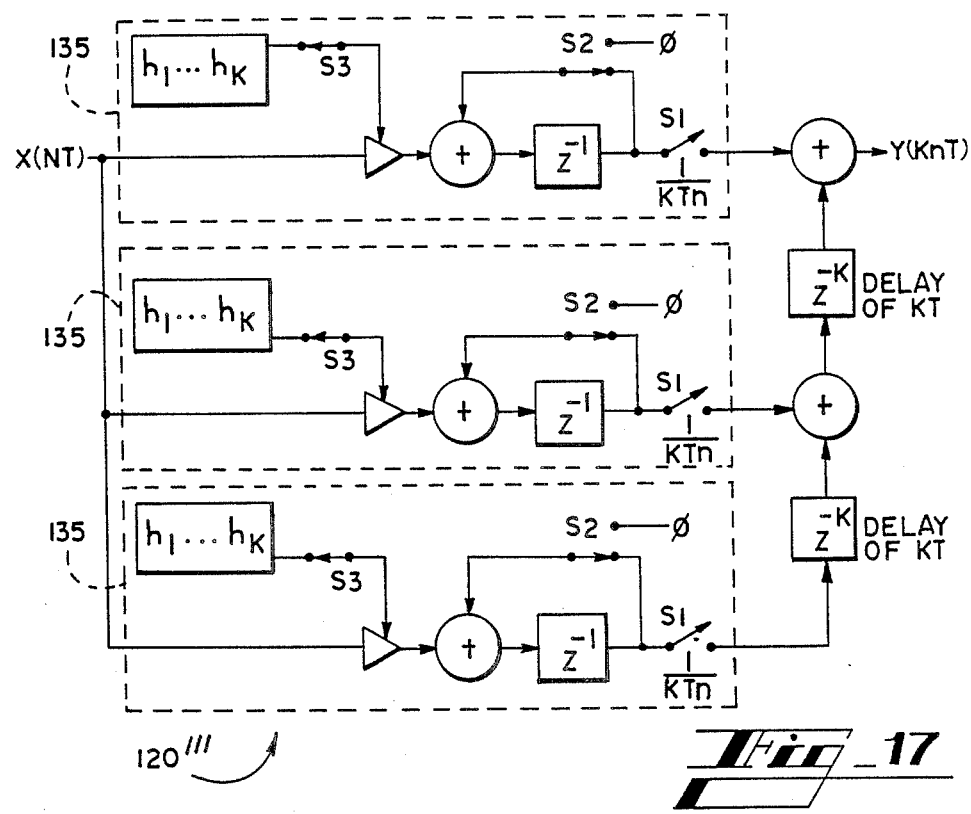
Fig_17

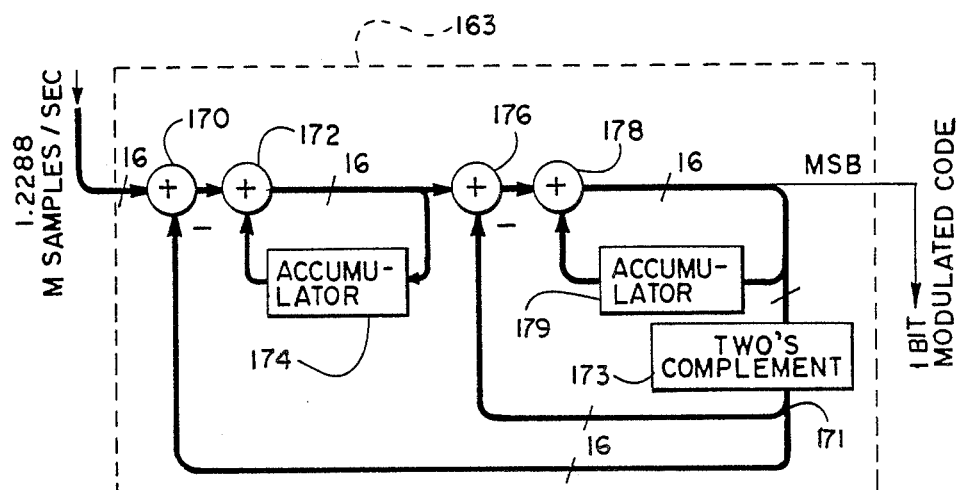
Fig_20
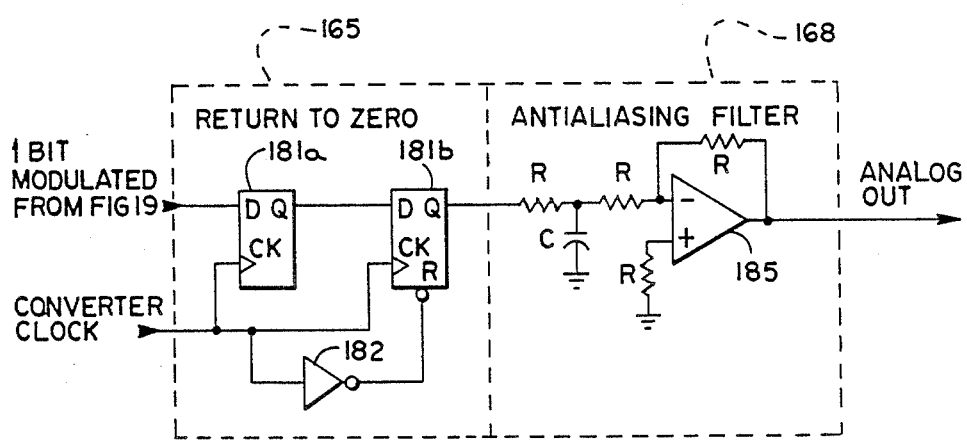
Fig_21

HIGH PERFORMANCE SIGMA DELTA BASED ANALOG MODEM FRONT END

TECHNICAL FIELD

The present invention relates generally to data telecommunications circuitry, and relates more particularly to a novel sigma delta modulator front end circuit for a high speed (e.g., 9600 bits per second) modem.

BACKGROUND

In the recent past, distortion levels in commercial modulator/demodulator circuits ("modems") for data communications were rarely a critical design parameter. Generally, the speeds of data transfer were low enough and the dynamic range of signal levels was low enough that distortion was not a significant problem. Classical performance requirements, for example signal-to-distortion levels of about 50 dB, are easy to achieve using well established design and layout techniques.

In the high speed data communications environment, for example in a 9600 bps full duplex echo-cancelling V.32 modem, performance requirements are much higher. The minimum acceptable signal-to-distortion level is on the order of 72 dB for such modems. These higher performance specifications clearly call for much greater care in design to reduce harmonic distortion.

Sigma delta modulation is a technique described in the prior art literature which has been suggested for use in "codec" (coder/decoder) line cards employed in telephone company central offices for converting voice signals into digital form for communication transmission. The technique, a form of pulse code modulation (PCM), involves oversampling, integration and feedback for moving quantization noise out of baseband into a spectral region where it can be digitally filtered and eliminated. However, the present inventors do not have any knowledge that sigma delta modulation has ever been employed in a modem, due in part to the high signal processing speeds which must occur.

Sigma delta modulation has been employed in digital-to-analog converter (D/A) and analog-to-digital (A/D) converter circuits. One known problem encountered with conventionally constructed sigma-delta modulators in the D/A application is that the performance of the method is less than theory predicts. The inventors herein believe that this problem is probably common to other applications which employ oversampling to obtain high resolution and linearity.

Theory predicts that a second order sigma delta modulator will obtain an improvement in resolution of about 15 dB per octave of oversampling. When considering a one-bit D/A converter, and using an oversampling factor of 128, theory predicts a resolution of 105 dB. Actually constructed devices employing conventional methods for implementing sigma delta modulation have been observed to exhibit a much poorer performance; in one experiment conducted by the inventors there was an unexplained harmonic distortion of −27 dB. It is believed that the source of the unsatisfactory performance relates to the rise and fall times of the analog signal in the one-bit D/A converter. It is also believed that the distortion is caused when the rise and fall times of the one bit D/A converter are not equal.

Some prior art modem designs employ switched capacitor integrators as a part of the filters and A/D converters in the analog front end for the circuit, that is, the portion of the circuit that interfaces with the telephone line. There are numerous sources of distortion in switched-capacitor integrators, for example capacitor non-linearities and operational amplifier gain and slew rate non-linearities. However, it is believed by the inventors herein that distortion induced by signal level dependent charge injection from the switching MOSFETs in switched capacitor integrators is the dominant distortion mechanism in circuits which employ such integrators.

Accordingly, there is a need for low distortion circuits for use in constructing V.32 or other similar high speed data communications circuits such as modems. In particular, there is a need for a low distortion switched capacitor integrator and for a workable high performance sigma delta modulator for use in such high speed data communications circuits.

SUMMARY OF THE INVENTION

Briefly described, the present invention comprises an improved analog front end circuit for a modem which employs sigma delta modulation for the analog-to-digital (A/D) as well as for the digital to analog (D/A) conversion functions. The preferred analog front end comprises a sigma delta modulating one bit D/A converter which converts an incoming digital signal from a data processing device into an analog signal for transmission by the modem. A novel return-to-zero (RTZ) circuit reduces distortion caused by unequal energies in signals representing a zero and signals representing a one. A low pass filter then completes the conversion into the analog signal.

The present invention further comprises an oversampling sigma delta modulating A/D converter which converts an incoming analog signal to the modem into a plurality of digital signal samples and shifts quantization noise out of the baseband of the incoming analog signal. A digital low pass filter filters quantization noise from the output of the analog-to-digital converter. A decimator reduces the number of digital signal samples to provide a digital signal at the final A/D output having a signal rate less than the rate of the digital signal samples.

More particularly described, the oversampling sigma delta modulator comprises a novel low distortion four phase clocked fully differential CMOS switched capacitor integrator, which is suitable for use as an integrator in other circuits requiring low distortion such as analog-to-digital converters and other types of data conversion and telecommunications devices. The present invention provides a four phase clocking technique that reduces the distortion mechanism in fully differential integrating circuits to a level in excess of the requirements for a V.32 modem.

The preferred integrator includes means for eliminating signal-dependent charge injection distortion in MOSFET switches which are employed as part of a pair of cascaded switched capacitor integrators in the sigma delta modulator. The preferred circuit arrangement for eliminating signal-dependent charges comprises means for sampling the incoming signal and timing means operative to control the switching of the sampling means and the transferring of signal to the integrator in a manner as to cause any signal-dependent charges to be returned to ground or to input circuits instead of accumulating in the integrator. The timing means is first operative for switching on first and second sampling transistors or switches at a predetermined time to sample the incoming signal on a sampling means.

Then, the timing means is operative for switching off the second transistor or switch coupled to the ground side of the sampling means prior to switching off the first transistor or switch coupled to the input signal so that any charges associated with the first transistor or switch are returned into the sampling circuit and the source circuit for the incoming signal. This may cause voltage offset but no signal dependent distortion.

The timing means is then operative for switching on a third and fourth transistor connected to opposite sides of the sampling means so that the charge on the sampling means is transferred to an integrating circuit. The timing means is thereafter operative for switching off the third transistor prior to switching off the fourth transistor so that any incoming signal-dependent charge on the third transistor is returned to ground when the fourth transistor is switched off.

Accordingly, it will be appreciated that in the disclosed embodiment, the improved low distortion circuit includes timing means for controlling the timing of the switching of first, second, third and fourth MOSFET transistor switches which control the sampling of the input signal and the transfer of charge from the sampling means to the integrating means such that any signal dependent charges associated with the MOSFET switches are not transferred to the integrating means.

Yet still more particularly described, the preferred signal-dependent charge eliminating means comprises means for switching on a first pair of MOSFET switching transistors comprising a first and second transistor for connecting an incoming signal to a sampling capacitor of the integrator at a first predetermined time; means for switching off the second or ground-connected transistor of the pair prior to switching off the first or incoming-signal transistor so that an incoming signal-independent charge is injected into the sampling capacitor and the source circuit for the incoming signal, thereby causing voltage offset that no incoming signal-dependent distortion; means for switching off the first transistor subsequent to switching off the second transistor so that any incoming signal-dependent charge is returned to the source circuit for the incoming signal; means for switching on a second pair of MOSFET switching transistors comprising a third and fourth transistor at a second predetermined time to transfer the charge on the sampling capacitor to an integrating capacitor; means for switching off the third transistor, connected between the sampling capacitor and the integrating capacitor, prior to switching off the fourth transistor, also ground connected, so that any incoming signal-independent charge is injected to the sampling capacitor in the integrator, thereby causing voltage offset but no signal dependent distortion; and means for switching off the fourth transistor subsequent to switching off the third transistor so that any incoming signal-dependent charge in the fourth transistor is returned to ground.

It will thus be appreciated that the present invention comprises an improved four phase clocked switched capacitor sigma delta based A/D converter, and can be considered as an improved integrating circuit, wherein signal dependent charges which result from the switching of the four phase clocked switch capacitor integrating network is eliminated.

The preferred sigma delta modulator further includes a novel return-to-zero means for use in a sigma delta based integrating D/A circuit which reduces distortion in a bit stream of single bit digital signal samples caused by unequal energies in signals representing a zero and signals representing a one. The circuit operates by returning the signal level to zero for each bit of output from the integrator, whether a one or a zero, prior to the next bit of output. This compensates for unequal rise and fall times of bit streams which may include sequences or strings of all one's. Such a bit stream results in a source of distortion since the energy contained in the signal representing a string of all one's is not equal, on the average, to another string of signals which should average the same over time.

The preferred return-to-zero means comprises a first latching circuit which stores the output of the integrator on a leading edge of the clock signal, a second latching circuit for storing the output of the first latching circuit on the next subsequent occurrence of the clock signal, and reset means for resetting the second latching circuit to an initial or zeroed condition on the trailing edge of each clock signal. The output of the second latch circuit corresponds to the output of the return-to-zero means. Advantageously, all of the ones in a bit stream of ones and zeros will have equal energies, since consecutive ones or consecutive zeros are all returned to a zero initial condition prior to the beginning of the next signal time, to remove distortion which might occur as a result of unequal energies, as for example when a string of consecutive ones occurs.

A second preferred solution to the unequal rise and fall time problem is the use of a fully differential output stage. The distortion caused by the unequal rise and fall times will show up as a common mode signal and will be cancelled by the differential amplifier structure.

Accordingly, it is a particular object of the present invention to provide a low distortion analog front end for a V.32 or other high performance modem.

It is another object of the present invention to successfully implement a sigma delta modulator to substantially eliminate distortion due to quantization noise in a low distortion high speed modem.

It is another object of the present invention to reduce quantization noise in data converters at a reasonable cost.

It is another object of the present invention to employ sigma delta modulation in an echo-cancelling modem to solve the stringent high performance requirements of an analog front end using the V.32 standard recommendation.

It is another object of the present invention to provide a four phase clocking technique which reduces the MOSFET charge injection distortion mechanism in fully differential circuits to a level in excess of the requirements for a V.32 modem.

It is another object of the present invention to provide an improved front end for a modem which exhibits signal-to-noise ratios in excess of 100 dB.

It is another object of the present invention to provide a sigma delta modulator for use in an echo-cancelling modem.

It is another object of the present invention to provide a fully differential switched capacitor sigma delta modulator analog-to-digital converter to reduce the effects of parasitic line noise and distortion introduced by capacitor and operational amplifier nonlinearities.

It is another object of the present invention to provide an improved analog circuit semiconductor chip layout for an integrator circuit which minimizes clock and other digital signal feedthrough to analog circuit components.

It is another object of the present invention to eliminate distortion induced by asymmetrical rise and fall times of pulses in a serial D/A converter.

It is another object of the present invention to reduce distortion induced by nonlinear voltage dependence of polysilicon-to-polysilicon integrated semiconductor circuit capacitors, and distortion due to operational amplifier gain nonlinearity in a fully differential analog circuit.

It is another object of the present invention to provide an improved, low distortion one bit digital-to-analog converter for use in data telecommunications circuits such as modems.

It is yet another object of the present invention to increase power supply noise rejection and reduce clock feedthrough noise in the fully differential circuits of a high performance analog front end for a modem.

It is another object of the present invention to eliminate distortion induced by signal dependent charge injection resulting from switching in a four-phase switched capacitor sigma delta based signal converters, switched capacitor integrators, or other circuits which employ switched capacitor circuits.

It is another object of the present invention to provide an improved low distortion integrator circuit for use in a sigma delta modulator and other applications requiring signal integration.

It is another object of the present invention to provide an improved low distortion modem analog front end which is suitable for V.32 and even V.33 communications standards.

It is another object of the present invention to provide an improved finite impulse response (FIR) digital filter.

It is another object of the present invention to provide an improved FIR digital filter which also decimates an oversampled input digital signal.

It is another object of the present invention to provide a decimating FIR digital filter which can be readily implemented in VLSI circuitry with minimal logic.

These and other objects, features, and advantages of the present invention may be more clearly understood and appreciated from a review of the following detailed description of the disclosed embodiments and by reference to the appended drawings and claims.

BRIEF DESCRIPTION OF THE DRAWING FIGURES

FIG. 2 is a spectral diagram illustrating the required technical performance requirements for the receiver signal-to-noise ratio for a high speed low distortion modem such as a V.32 modem.

FIG. 3 is a conceptual diagram illustrating the analog-to-digital conversion stage employed in the preferred embodiment shown in FIG. 1.

FIG. 6, consisting of FIGS. 6A and 6B, is a schematic diagram and timing diagram showing error and waveform distortion caused by charge injection in a prior art two phase switched capacitor integrator circuit.

FIG. 7 is a schematic diagram illustrating a prior art four phase switched capacitor integrator circuit.

FIG. 8 is a timing diagram illustrating the four phase clocking scheme employed in the preferred embodiment of a switched capacitor integrator circuit.

Figure 4:
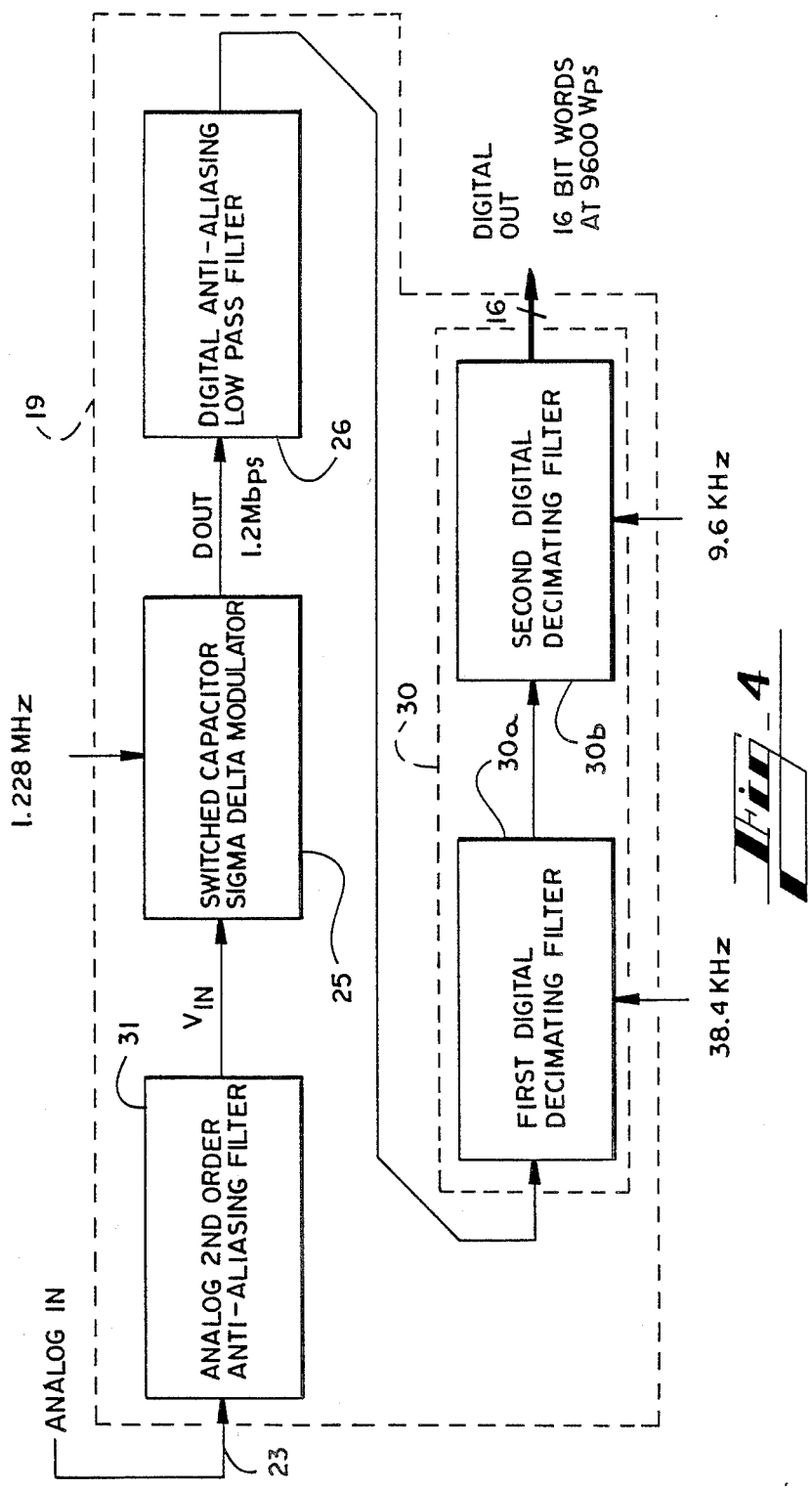
FIG. 4 is a block schematic diagram illustrating the analog-to-digital conversion stage employed the preferred embodiment shown in FIG. 1.

FIG. 9 is a "floorplan" layout diagram of an analog integrated circuit chip of the preferred sigma delta modulator circuit illustrated in FIGS. 3 and 4.

FIG. 10 is a more detailed floorplan layout diagram of the analog integrated circuit chip shown in FIG. 9, showing the symmetrical wiring layout.

Figure 11:
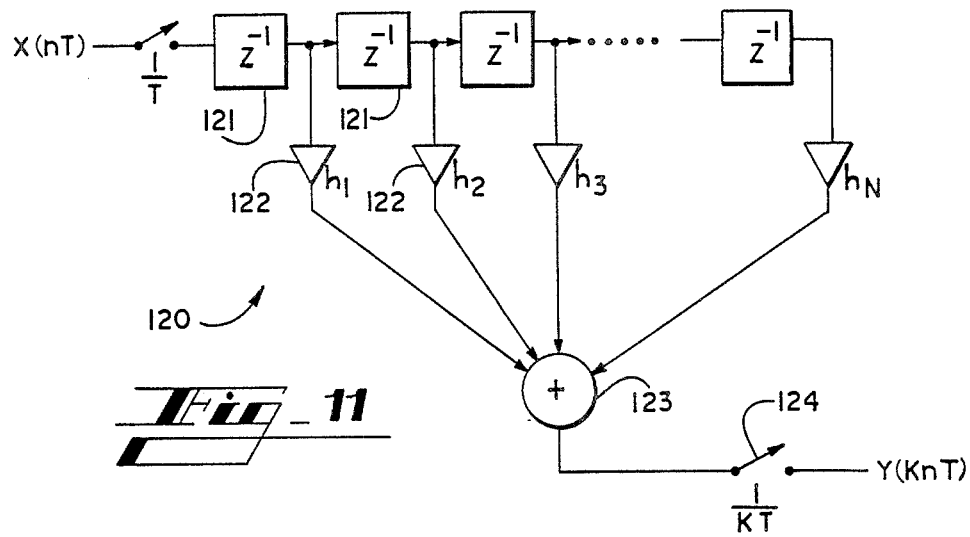

FIG. 11 is a generalized block diagram of an FIR digital filter of length N.

Figure 12:
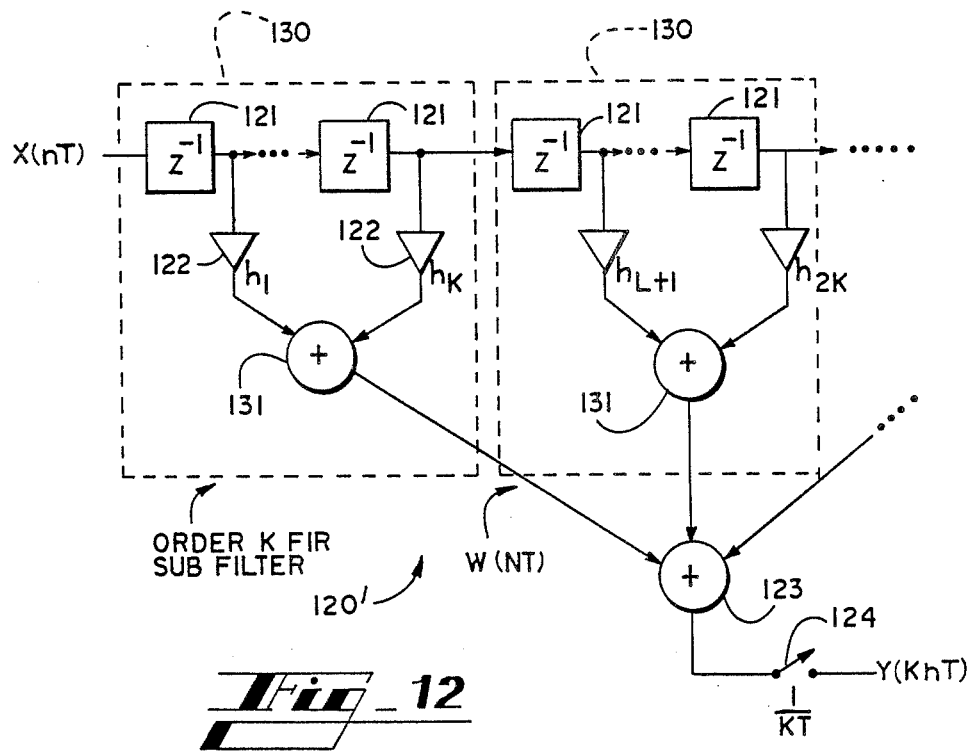

FIG. 12 is a generalized block diagram of the FIR filter of FIG. 11 divided into functional blocks to effectuate decimation.

FIG. 13 illustrates the application of Tellegan's Theorem to the block diagram of FIG. 12.

FIG. 14 illustrates a ROM-based equivalent block diagram for the FIR filter of FIG. 13.

FIG. 15 illustrates an FIR filter equivalent to that shown in FIG. 14 for L=3 and a one bit input data stream, as generally employed in the preferred embodiment.

FIG. 16 illustrates the application of Tellegan's Theorem to the block diagram of FIG. 15.

FIG. 17 illustrates an expanded form of the block diagram of FIG. 16 in a form suitable for VLSI implementation.

Figures 18, 19:
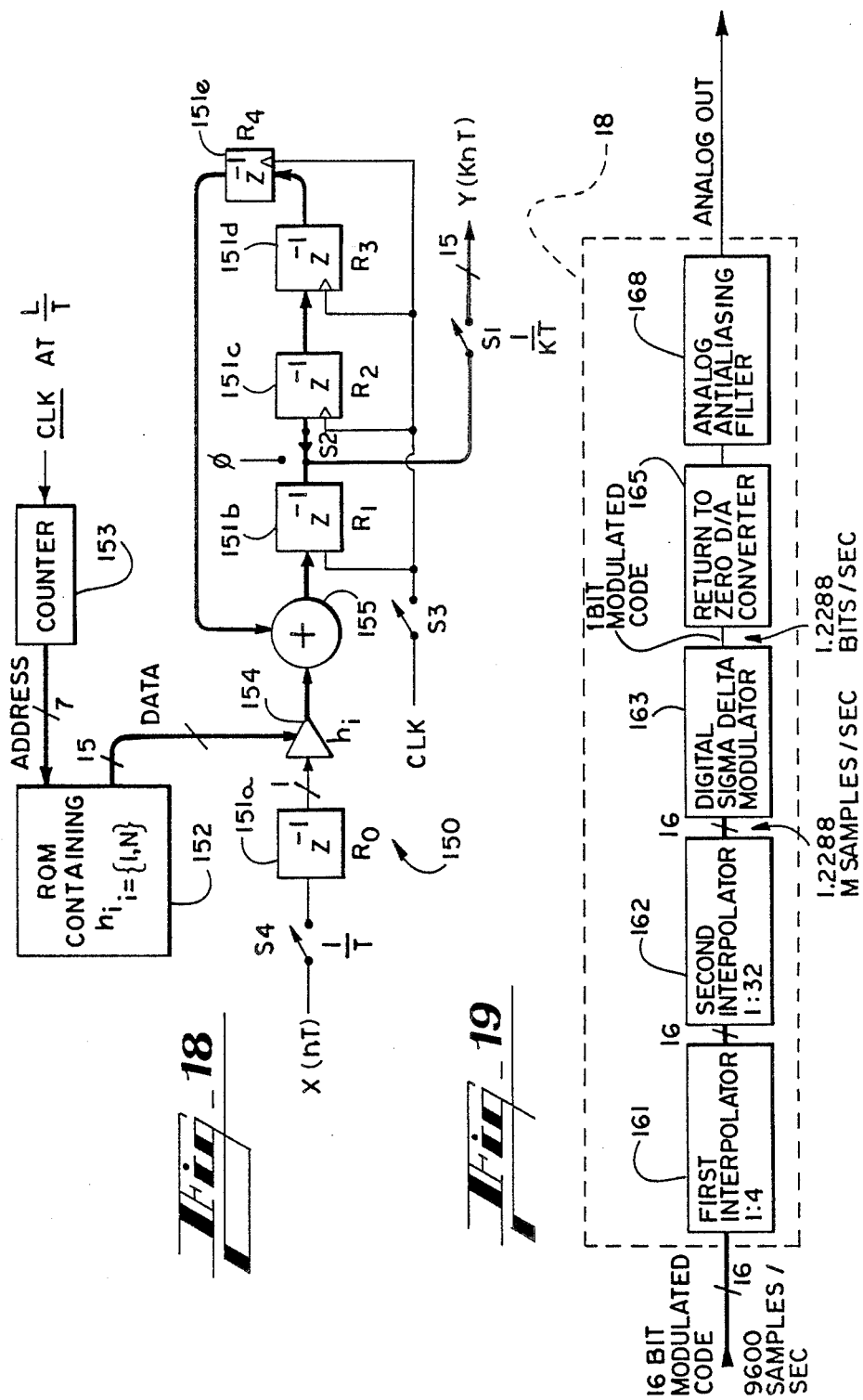

FIG. 18 illustrates a preferred ROM-based decimating FIR filter for the case where L=3.

Figure 1:
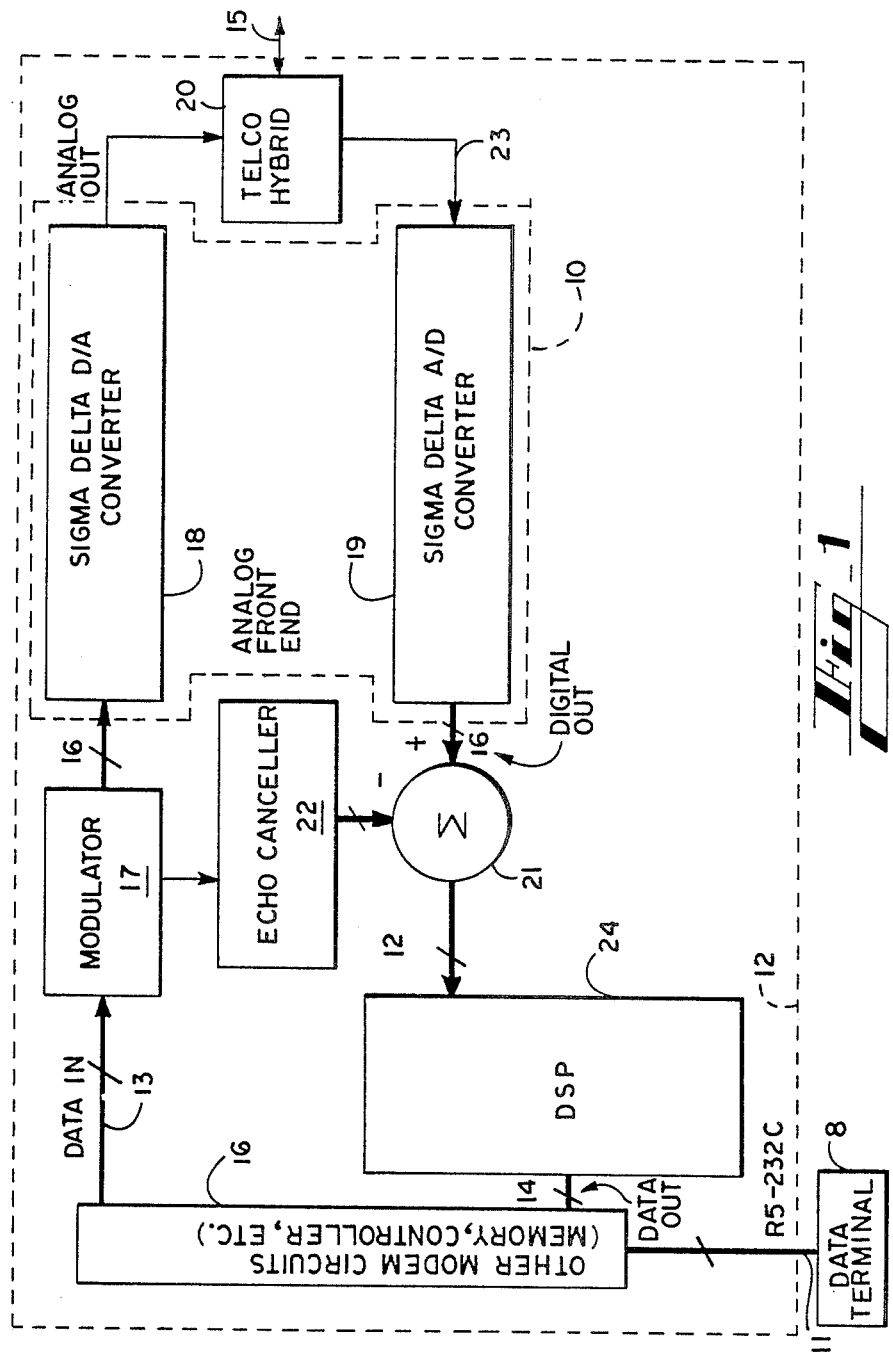
FIG. 1 is a block schematic diagram illustrating a modem incorporating a sigma delta modulator based analog front end constructed in accordance with the preferred embodiment of the present invention.

FIG. 19 is a schematic block diagram of the sigma delta modulator digital to analog converter employed the preferred embodiment shown in FIG. 1.

FIG. 20 is a block diagram of a digital sigma delta modulator employed in the preferred sigma delta modulator digital to analog converter shown in FIG. 19.

FIG. 21 is a detailed schematic diagram of the return-to-zero one bit differential digital to analog converter employed in the preferred sigma delta modulator digital to analog converter shown in FIG. 19.

DETAILED DESCRIPTION OF THE PREFERRED EMBODIMENT

Referring now to the drawings, in which like numerals indicate like elements throughout the several views, and referring first to FIG. 1, there is illustrated an analog front end circuit 10 in a modem 12, all constructed in accordance with the preferred embodiment of the present invention. The modem 12, in addition to the analog front end circuitry 10, includes several other components, many of which are conventional and will be known to those skilled in the art. The preferred embodiment is included in a modem which typically includes a microprocessor, which is included within the other modem circuits. An external data terminal 8, which may be a digital computing machine or some other digital device, communicates with and is connected to the modem 12 by an RS-232C interface 11. The modem 12 is also connected to a subscriber telephone line 15 so that data may be exchanged with some remote device. It will be appreciated that the number of conductors in telephone line 15 will be two or more, depending upon the particular user's telephone system.

The modem 12 converts data from the RS-232C format to a format suitable for transmission over a telephone line 15, and vice versa.

Inside the modem 12, the analog front end circuits 10 in FIG. 1 are connected to other modem circuits 16. It will be appreciated that the other modem circuits 16 comprise, for example, signal input and output conditioning and isolation circuits, voltage regulators and filters, phase locked loops, status indicators, frequency synthesizers, memory, and a microprocessor/controller, all of which will be known to those skilled in the art. Exemplary details of how the various functions of a modem are controlled by a microprocessor are found in U.S. Pat. Nos. 4,431,867 and 4,504,802, which are assigned to the assignee of the present invention.

For purposes of describing FIG. 1, it should be understood that the other modem circuits 16 provide data for outgoing transmission via a DATA IN bus 13, through modulator 17, and to the front end circuit 10. Similarly, the other modem circuits 16 receive demodulated data from an incoming transmission on DATA OUT bus 14 from digital signal processing circuits 24. For outgoing data, the modem front end 10 prepares data for transmission over the telephone line 15. The modulator circuit 17 receives the data for transmission over bus 13 and provides an analog modulated signal to the front end circuitry 10. The modulator 17 may be constructed as described in U.S. Pat. No. 4,504,802 to Heatherington, which is also owned by the same assignee as the present invention. The output of modulator 17 is therefore a four-phase differential phase shift keyed digital signal which is then provided to the modem front end 10, and in particular to a digital-to-analog (D/A) converter 18 contained therein. The output of the D/A converter 18 is then provided to a conventional telephone company hybrid circuit 20, which is connected to the telephone line 15.

Incoming signals from the telephone line are provided through the hybrid circuit 20 to a sigma delta analog-to-digital (A/D) converter 19, also within the front end circuitry 10. The output of the sigma delta A/D converter 19 is provided to a summing circuit 21, which is digital, which combines the digital output with signals from a conventional echo cancelling circuit 22. As will be understood by those skilled in the art, echo in data telecommunications is composed of several elements. The "near end" echo comprises leakage from the modem hybrid circuits 20, on the order of 6-8 dB below the transmitted signal level. Another component of near end echo is that from the central office hybrids. These hybrids are never truly matched to the line, and some of the transmitted energy will return from these hybrids as echo.

At the far end there is another central office with its hybrid, and the other hybrid circuit of another modem. These elements will have a much longer round-trip delay than the near end echo, on the order of several tens of milliseconds, as compared to microseconds for the near end echo.

Using the echo canceller 22, the near end and far end echoes are subtracted from the total composite received signal, supposedly leaving only the signal transmitted from the far end modem.

The preferred echo canceller 22 in the modem 12 is assumed to be linear, and comprises an adaptive linear transversal FIR digital filter which provides on the order of 75 dB of echo cancellation. If one assumes that transmissions occur at 0 dBm, what is received from the other modem is on the order of −45 dBm. In order to effectively carry out V.32 or the like demodulation correctly, there needs to be 22-23 dB signal-to-noise ratio, or more conservatively 30 dB. Accordingly, a noise floor of −75 dB as seen by the receiver is required. This means that the transmitted data must be attenuated by 75 dB with the echo canceller 22, because the transmitted data basically shows up as noise to the receiver.

The digital echo-cancelled signal, after the echo canceller 22, is provided then to a digital signal processing circuit 24 (DSP), which performs additional modem functions such as demodulation, timing signal recovery, decision making, and adaptive equalization, and then provides the DATA OUT digital signals on bus 14. Inasmuch as these functions are digital functions which do not form a part of the present invention, no further discussion of same will be provided herein.

It is a particular object of the present invention to provide a level of performance in the front end 10 for the modem 12 so that the V.32 protocol may be implemented in a highly efficient and effective manner. In this regard, FIG. 2 is an example of typical requirements for receiver signal-to-noise ratios which must be present in order to minimally meet the V.32 standards. If the maximum signal level at the transmitter (TX) is at 0 dBm for reference, then the minimum signal at the receiver (RCV) is specified at no lower than −43 dBm from the transmitter. With a receiver signal-to-noise ratio of 21 dBm, the total noise floor must be set at −64 dBm. If the total noise floor is −64 dBm, then it may be seen that the noise components of filter noise may be on the order of −70 dBm and the channel noise may be on the order of −72 dBm. This leaves quantization noise at about −78 dBm. Accordingly, it will be appreciated that the performance level of the receiver must be −78 dBm or better.

In the present invention, signal-to-noise ratios on the order of −105 dBm are possible.

Sigma Delta A/D Converter

In the present invention, significant improvements in the signal-to-noise ratio are achieved by utilizing sigma delta modulation in the A/D conversion process, and in particular by utilizing an improved four phase clocking scheme and layout for such a device. In addition, sigma delta modulation is employed in the D/A conversion process to obtain similar noise reduction improvements. It has been determined that for satisfactory implementation of V.32 and other high speed data communications protocols in modems, total harmonic distortion and other nonlinearities should not exceed 75 dB, that is, there is an equivalent noise floor of −75 dB with respect to the fundamental signal frequency. A significant factor in harmonic distortion is the quantization noise in the analog-to-digital conversion process, which of course is a function of the number of bits. While twelve bit, fourteen bit, and other converters are commercially available, they are expensive and are typically laser trimmed. Thus, reduction of quantization noise at a reasonable cost is a significant object of the present invention.

While oversampling is a known method of reducing quantization noise, it usually increases bandwidth. Let the sample rate be defined as $2^L f_n$, where $f_n$ is the Nyquist frequency, and L is number of octaves of oversampling. In the preferred embodiment for a V.32 modem, $f_n = 9600$, $2^L = 128$, and therefore L=7. Considering that a voice-grade telephone line only exhibits a bandwidth of about 3600 Hz, the highest frequency of interest is about 3500–3600 Hz for a modem. About 4800 Hz would be required for frequency division multiplexing on a dedicated line, but there is not enough bandwidth for conventional voice grade telephone lines. For frequency division multiplexing, about 2400 Hz of bandwidth is required for transmitted data, with a guard band of at least 100 Hz, and 2400 Hz for received data, for a total of 4900 Hz, but this exceeds the available bandwidth.

For a 9600 bit per second transfer rate, the bandwidth requirement is 7000 Hz minimum, which is two times the bandwidth of 3500 Hz, so either 7200 or 9600 is selected to be an even multiple of two. Since the baud rate is 2400, and since it is desirable to have an even multiple of the baud rate for digital signal processing, 9600 emerges as the bit transfer rate.

Assume that the A/D converter operates at some rate higher than the Nyquist rate, and that the baseband signal stops at $f_n/2$. Quantization noise is a fixed feature for a fixed number of converter bits. For a conventional twelve bit A/D converter, quantization noise is on the order of 72 dB. By oversampling, there is about 3 dB per octave enhancement; every time the sampling rate is doubled, the noise in the band is halved. Quantization noise appears as white noise, spread out evenly across the band.

Turning now to FIG. 3, it will be seen conceptually that the sigma delta A/D converter 19 comprises a sigma delta modulator circuit 25 which receives the input analog signal from the hybrid circuit 20 on line 23. The sigma delta modulator 25 output is a digital bit stream at a sample rate of 1.2288 MHz. This bit stream is then provided to a low pass filter 26 for purposes of substantially eliminating quantization noise above a predetermined cut-off frequency; the quantization noise is effectively shifted above the cut-off frequency of the low pass filter 26 by the operation of the sigma delta modulator 25. The low pass filter 26 provides a parallel 16 bit signal to a decimator circuit 30, which decimates the digital signal to achieve a 9600 per second sample rate.

In other words, the output of the decimator 30, and thus of the sigma delta A/D converter 19, is 9600 samples per second, each sample comprising 16 parallel bits of information, and wherein the quantization noise has been substantially eliminated by low pass filtering. The A/D converter 19 in the preferred embodiment converts samples at a rate of 800 nanoseconds in order to satisy the 9600 bit per second data rate, which corresponds to 1.2288 megasamples/sec. This is a very fast sampling rate, and currently available digital signal processing circuits are hard pressed to operate at these rates. Conventional digital signal processing is usually optimal at a sampling rate of about 10 kHz, which is well below the required rate of 1.2288 MHz. Accordingly, the digital decimator 30 gets rid of oversamples.

The decimator 30 brings down effective sampling rate by a factor of 128. This is done in two stages in the preferred embodiment, as shown in FIG. 4. There is a first decimation filter stage 30a which reduces by a factor of 32, and the second is a second decimation filter stage 30b which reduces by a factor of 4. The first stage decimation filter 30a is a novel filter constructed as described hereinbelow, as an improved FIR decimating filter. The second stage 30b is more conventionally constructed, and in the preferred embodiment is constructed in accordance with the paper by Candy et al., "A Voiceband Codec with Digital Filtering," *IEEE Trans. Commun.*, vol. COM-29, pp. 815–830, June 1981, which is incorporated by reference herein and made a part hereof.

In the preferred embodiment, the low pass filter 26 is a digital filter of the type $$\left(\frac{\sin x}{x}\right)^3,$$

which will be known to those skilled in the art. Further details pertaining to the decimator 30 are provided below.

Still with reference to FIG. 4, the preferred sigma delta sixteen bit linear oversampled A/D converter 19 will be described in greater detail. An analog second order anti-aliasing filter 31 receives the analog input signal on line 23 prior to the sigma delta modulator 25. After filtration, the signal is then provided to the switched capacitor sigma delta modulator 25. The circuit operates with a 1.228 MHz sample clock so that there are about eight octaves of oversampling, assuming that the bandwidth of the input signal does not exceed about 4 kHz. The low pass filter 26 then receives a serial bit stream at 1.228 MHz, and provides a sixteen parallel bit output word to the decimator 30.

The decimator 30 in FIG. 4 comprises a first digital decimating filter 30a which has an output word rate of 38.4 kHz, followed by a second digital decimating filter 30b which has an output word rate of 9.6 kHz, yielding sixteen bit words. In the preferred embodiment, the first digital decimating filter 30a is a FIR and the second digital decimating filter 30b is an IIR.

SWITCHED CAPACITOR SIGMA DELTA MODULATOR

Figure 5:
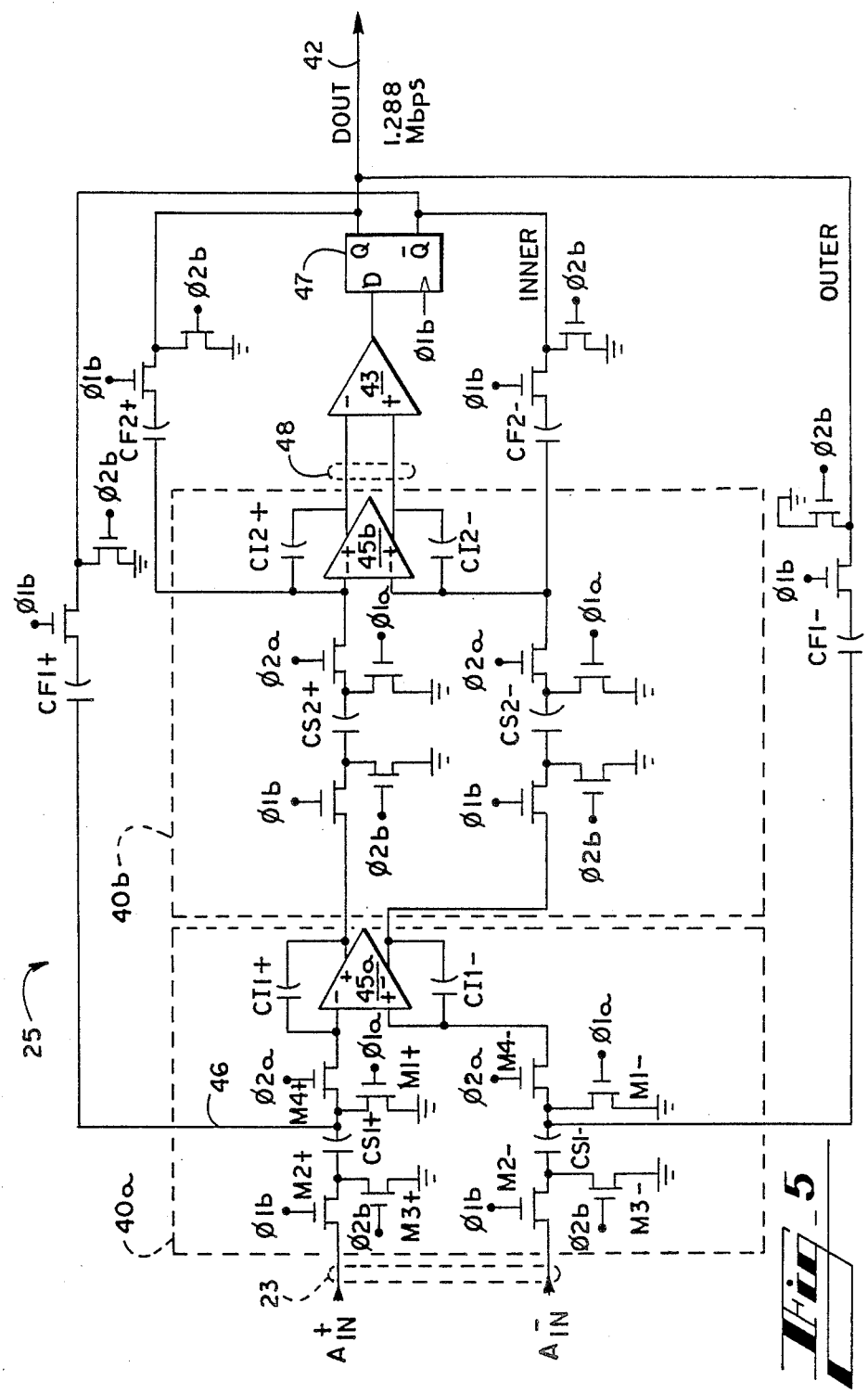
FIG. 5 is a detailed schematic diagram of the preferred embodiment of the four phase clocked sigma delta modulator analog-to-digital converter constructed in accordance with the preferred embodiment of the present invention, as employed in the modem of FIG. 1.

FIG. 5 is a detailed schematic diagram of the sigma delta modulator 25 employed in the A/D converter 19 constructed in accordance with the preferred embodiment of the present invention. As will be recalled from the discussion above, conventional sigma delta modulators do not provide sufficient performance capability for use in the present invention. Accordingly, several features in particular are provided in the sigma delta modulator 25 of the present invention, which improve performance to an extent very close to the theoretically achievable performance.

First of all, a pair of differential integrators 40a, 40b are provided in series at the input end, to integrate the differential input signal provided on line 23. The use of differential integrators and differential signals ensures that any common mode errors will not affect the performance. Secondly, each of the integrators 40a, 40b is clocked with the novel four-phase clocking scheme, to be described in detail below. Finally, double integration is effectuated with the integrators 40a, 40b, which avoids overloading and allows the achievement of signal-to-noise ratios on the order of −105 dB. The output of the second integrator circuit 40b is provided on line 42 and comprises a 1.288 MHz serial digital bit stream, each pulse having an identical width, which is suitable for provision to a digital low pass filter 26.

The analog input signal on line 23 is provided to the first integrator 40a and comprises the signals $A_{in}{}^+$ and $A_{in}{}^-$. These signals are first provided through a first switching MOSFET transistors M2+, M2−, and thence to sampling capacitors CS1+, CS1−. Both MOSFETs M2+, M2− are clocked at time Φ1b. The timing signals are discussed in more detail in connection with FIG. 8.

A pair of second MOSFET transistors M3+, M3− are connected to a first plate of the sampling capacitors CS1+, CS1−, respectively, and at time Φ2b connect ground to the first plate of the capacitor.

The opposite or second plates of the sampling capacitors CS1+, CS1− are connected through MOSFETs M4+, M4−, respectively, to the inverting and noninverting inputs, respectively, of a differential operational amplifier 45a. Both MOSFETs M4+, M4− are switched at time Φ2a. Switching MOSFET transistors M1+, M1− connect ground to the second plates of the sampling capacitors CS1+, CS1−, respectively, at time Φ1a.

The integration function is performed by integrating capacitors CI1+, CI1−, which are connected as follows: the noninverting output of the op amp 45a is fed back to the inverting input through integrating capacitor CI1+ to the inverting input, while in like manner the inverting output is fed back through integrating capacitor CI1− to the noninverting input.

The differential outputs of the op amp 45a, and thus of the integrator circuit 40a, are cascaded to a second integrator stage 40b which is constructed exactly as is circuit 40a. There is provided in the second integrator stage 40b similar four-phase switched MOSFETs M1+, M1−, M2+, M2−, M3+, M3−, M4+, and M4− as in the first stage 40a, except that the sampling capacitors are identified as CS2+ and CS2− and the integrating capacitors are identified as CI2+ and CI2−. The second integrator stage 40b is clocked with the novel four phase clocking method as the first integrator stage 40a, described in connection with FIG. 8.

The output of the integrator circuit 40b is then provided in differential form to a comparator circuit 43, which provides an output when there is a non-zero voltage between the two input lines 48. The output of comparator 47 is provided to the D input of a delay-type flip flop 47, which is clocked with the clock signal Φ1a. The Q output of the flip flop 47 is the output signal DOUT on line 42, which is a digital 1.2 M bps bit stream.

Still referring to FIG. 5, feedback capacitors CF1+, CF1, CF2+, CF2− form parts of the inner and second loops of feedback for sigma delta modulation, and correspond to the inner and second loops of the quantizer shown in FIG. 3 of the paper by James C. Candy, "A Use of Double Integration in Sigma Delta Modulation," *IEEE Trans. Comm.*, Vol. COM-33, No. 3, March 1985, pp. 249-258, at p. 251, the disclosure of which is incorporated herein by reference and made a part hereof. The outputs of the flip-flop 47 are used essentially as voltage references (+VR, −VR) for the op amps 45a, 45b, and switched at appropriate points in the timing cycle. Thus, the feedback capacitors perform the function of D/A conversion, since the latch output is a digital serial bit stream signal. All the feedback capacitors CF1+, CF1, CF2+, CF2− are connected to MOSFET switches which connect the capacitors between the latch 47 output and a summing node at the inputs of the op amps 45a, 45b. The switching occurs at time Φ1b to make the feedback connection and at time Φ2b to connect to ground. It will thus be appreciated that the structure of the feedback capacitors using the outputs of the latch as reference voltages merely performs a D/A conversion function so as to provide the appropriate feedback signal levels into the integrators.

PRIOR ART SWITCHED CAPACITOR CHARGE INJECTION DISTORTION

A primary source of distortion in circuits such as sigma delta modulators which employ switched capacitor designs is charge injection. Substantial elimination of this distortion is one of the principal objects of the present invention. FIG. 6 illustrates the error and waveform distortion caused by charge injection in a conventional two-phase switched capacitor integrator. The circuit of FIG. 6A is a conventional single ended (i.e., non-differential) switched capacitor integrator circuit, which is clocked with the two-phase clock as shown in FIG. 6B. As seen in FIG. 6B, the two-phase clock consists of two non-overlapping clock signals, Φ1 and Φ2. The input signal $V_{in}$ is shown as a rising input voltage. $V_{CS}$ is the sampling capacitor voltage as the sampling capacitor CS charges up during the signal sampling process.

When a MOSFET is turned on, a quantity of charge is stored in its channel. When the transistor is turned off by the falling edge of a clock signal at its gate, this charge is dissipated or injected into the neighboring circuit nodes. This charges causes an error in the sampled and integrated voltage represented by the charge stored on the sampling capacitor. Those skilled in the art will thus understand that the charge stored in the channel of MOSFET type transistors may be defined as:

$$\Delta Q = C_{oxide}(V_G' - V_{channel}) = C_{oxide}(V_G' - V_{in})$$ (EQUATION 1)

where
$\Delta Q$ = charge stored in MOSFET channel
$V_G$ = gate voltage (e.g., 5 volt clock signal),
$V_T$ = MOSFET threshold voltage,
$V_G' = V_G - V_T$,
$V_{channel}$ = channel voltage,
$V_{in}$ = input voltage, and
$C_{oxide}$ = gate oxide capacitance of M.

In actuality, the charge error comprises two separate components, a first being dependent only of the gate threshold voltage (for the clock) and a second being dependent on the sampled signal level. The former component need not be considered a source of error because because it gives rise to an offset voltage that is cancelled by the common mode rejection behavior of fully differential circuits. Thus, all circuits used herein are differential so as to eliminate this possible source of error.

Accordingly, when the MOSFET M2 in FIG. 6A (which is not shown differentially for the sake of simplicity) switches off at the falling edge of Φ1, approximately half of the ΔQ is returned to the $V_{in}$ driving circuit and half is injected into the sampling capacitor CS. This half of ΔQ is shown as $\Delta Q_1$ in FIG. 6.

Next, M3 turns off at the falling edge of Φ2, but the charge $\Delta Q_2$ injected into CS due to that transition is not signaldependent as the op amp input node is always being switched between ground and virtual ground, and therefore causes no distortion.

If the voltage sampled on CS is positive, M2 will turn off before M1, even though both are clocked by Φ1. The charge injected by M2 turning OFF ($\Delta Q_1$) will distribute partially into CS and partially back into the driving source at the integrator input (typically an op amp or buffer). At the end of Φ2, the charge sampled on CS during Φ1 has been completely transferred to CI. The Φ2 clock waveform now has a high-to-low transition turning OFF transistors M3 and M4. This again causes charge injection into CI.

ΔQ₁ is signal-dependent in that it varies with the magnitude of $V_{in}$. It is this latter half of ΔQ which accumulates and causes a signal-dependent error or distortion in the sampled voltage, $V_G' = V_G - V_T$. Similarly, when the transistor M1 turns off, a second error ΔQ₂ is ejected into CS. This causes a signal-dependent distortion consisting of the two charge components ΔQ₁ and ΔQ₂, as illustrated in FIG. 6B. Accordingly, there is a need for a switched capacitor integrator circuit which does not cause error and waveform distortion caused by charge injection.

Four phase clocking schemes are known for use in switched capacitor filters, for example the paper by Lee & Meyer, "Low Distortion Switched Capacitor Filter Design Techniques", IEEE JOURNAL OF SOLID STATE CIRCUITS, Vol. SC-20, No. 6, Dec. 1985, proposes a four phase clocking scheme for reducing distortion caused by clock feedthrough and charge injection. However, this particular four phase clocking scheme fails to recognize that the charge injection problem is primarily due to the sequence of connecting and disconnecting the input signal to the sampling capacitors, and therefore does not provide an adequate solution to the problem of charge injection.

REDUCTION OF CHARGE INJECTION DISTORTION BY NOVEL FOUR-PHASE CLOCKING METHOD

Referring back to FIG. 5, it will be understood that the clocking scheme for the integrators 40a, 40b differs in a significant aspect from known prior art four-phase switched capacitor integrator clocking schemes, such as the one shown in the Lee & Meyer article. As has been discussed, the novel clocking scheme employed in the present invention substantially reduces the distortion which may be caused by charge injection in the MOSFETs. It has been discovered that prior art techniques for connecting the sampling capacitors to the integration circuit allow an incremental charge to be accumulated in the physical structure of the MOSFETs, which accumulates and is ultimately injected into the sampling capacitor and provides the distortion component. Discovery and analysis of this problem resulted in the improved four-phase clocking system employed in the preferred embodiment.

Referring in this regard to the four-phase clock timing diagram of FIG. 8, it will be noted that the phases of the clock are such that Φ1b follows Φ1a by about 10 nanoseconds, and that Φ1a and Φ1b therefore overlap. Thereafter Φ2a occurs, followed about 10 nanoseconds later by Φ2b. Φ2a and Φ2b slightly overlap, but neither of these pulses overlap either of Φ1a or Φ1b.

With this timing in mind, it will be observed that the sampling of the input signals $V_{in}+$, $V_{in}-$ occurs when Φ1a has switched on transistors M1+, M1− and Φ1b has switched on transistors M2+, M2−. When Φ1a turns off transistor M1+, M1−, there is an injection of charge ΔQM1 which is generated and injected into the sampling capacitor CS, in accordance with the charge injection mechanism described above. However, since the voltage at node 46 is approximately zero, no distortion is induced since the voltage has not yet been transferred to the integrating capacitors. Nonetheless, there is a ΔQM1 charge which must be accounted for.

When Φ1b turns off at its trailing edge, it will be noted that the sampling capacitor CS is not grounded at node 46 (since transistor M1 is off). This causes ΔQM1 to be injected back into the source and does not remain in the sampling capacitor CS, since node 46 is floating. Again, there is no distortion allowed to form at this point.

The next significant event occurs when Φ2a and Φ2b turn on their respective transistors M4+, M4−, M3+, M3−. At this time, the voltage of the sampling capacitor CS is integrated by the integrating capacitors CI+, CI−.

When Φ2a goes low and turns off transistors M4+, M4−, a charge ΔQM4 associated with the plates of the MOSFET transistors M4 is injected both into the sampling capacitors CS and the integrating capacitors CI. Again, since the voltage at the node 46 is approximately zero (the other plates of the sampling capacitors CS are floating), no signal dependent distortion is induced.

Finally, when Φ2b turns off transistors M3+, M3−, the charge associated with the MOSFET M3, ΔQM3, is returned to ground since the sampling capacitors CS are not grounded at the other plate, since node 46 is floating. Accordingly, the charge on the sampling capacitors CS is not affected. It will thus be appreciated that the described four-phase clocking of the switch capacitor sigma delta oversampled A/D converter substantially reduces any distortion due to signal dependent charge injection. Inasmuch as the "a" clocking phase is turned off before the "b" clocking phases, and since node 46 is always switched between ground and virtual ground, the voltage at node 46 is independent of the signal level of the input voltage $V_{in}$.

In summary, the effect of the improved four phase switched capacitor method is as follows:

1. Φ1a and Φ1b ON: M2 and M1 ON, the input is sampled on CS.
2. Φ1a OFF and Φ1b ON: M1 turns OFF, its signal-independent charge is injected into CS and CI, causing voltage offset but no distortion.
3. Φ1a and Φ1b OFF: M2 turns OFF. Since the other side (CS side) of the switch is not connected to ground, the signal-dependent charge injected by M2 turning OFF is all returned to the source, and none of it causes an error in the charge on CS.
4. Φ2a and Φ2b ON: M4 and M3 ON, the charge on CS is transferred to CI (i.e., integrated).
5. Φ2a OFF and Φ2b ON: M4 turns OFF, its signal-independent charge is injected into CS and CI, causing voltage offset but no distortion.
6. Φ2a and Φ2b OFF: M3 turns OFF. Since the other side (the CS side) of the MOSFET switch is not connected to the op amp 45 and integrating capacitor CI, the charge returns to ground.

Using this four phase clocking technique, all signal-dependent charge injection caused by MOSFET switches turning off is cancelled. As has been earlier described, the actual implementation in the preferred circuit is fully differential, thus cancelling effects of voltage offset, capacitance and op amp gain nonlinearities, and op amp slew rate nonlinearity. In addition, the fully differential implementation results in a first order noise cancellation that also improves the overall signal-to-noise dynamic range of the A/D converter.

Those skilled in the art should pay close attention to a comparison between the prior art four phase clocking method of FIG. 7 and the preferred clocking method of FIG. 5. In particular, it will be noted that in the preferred clocking arrangement, the clock signals $\Phi 2a$ and $\Phi 2b$ are reversed when compared to the prior art clocking arrangement. In other words, the MOSFETs M4 are switched by the clock signal $\Phi 2a$ in the preferred embodiment, but clocked by $\Phi 2b$ in the prior art. Similarly, the MOSFETs M3 are switched by the signal $\Phi 2b$ in the preferred embodiment, but by $\Phi 2a$ in the prior art. The effect of this change in switching of the MOSFETs M3 and M4 is that in the preferred embodiment, M4 switches off before M3, thereby preventing signal-dependent charge injection through the sampling capacitors CS into the integrating capacitors CI.

ANALOG CHIP LAYOUT

The present invention further comprises integrated circuit layout features which minimize clock feed-through and other distortion mechanisms which are common in combination analog and digital integrated circuits. In particular, these features allow construction of a sigma delta modulator based A/D converter with very high performance of 105 dB of signal-to-noise ratio. Those skilled in the art will understand that it has always been a difficult design challenge to provide both analog and digital functions on a single semiconductor chip. Inasmuch as the present invention is constructed so as to provide 105 dB or better signal-to-noise ratio, it has been discovered that the arrangement and layout of the various portions of the sigma delta modulator with respect to other portions of the analog circuitry are important factors in maintaining the desired signal-to-noise ratio.

Referring in this regard to FIG. 9, the basic layout of the analog front end 12 is illustrated, exclusive of certain digital portions. It will be noted that the sigma delta A/D converter 19b is positioned in the center of the integrated circuit chip 60. Signals received from the hybrid circuit 20 (not shown in FIG. 9) are received on line 23 and provided to a receiver programmable gain amplifier 61, and then to the antialiasing filter 31. From the antialiasing filter 31, differential signals on lines 63 are provided to the sigma delta A/D converter 19b. Digital signals are confined to digital bus 65, and the layout specifically contemplates a minimum number of crossings of the digital lines with analog signals. In particular, it will be noted that the digital signals only cross at six different places, which are denoted as 66a, 66b, ... 66f.

Also provided on the analog integrated circuit chip 60 are other supporting circuitry required in the modem, including a transmitter filter 71, clock generator circuitry 72, biasing circuits 73a, 73b, and audio path circuitry 74. The audio path circuit 74 receives the output of the antialiasing filter 31 and provides an audio signal path to a monitor on the MON output. Many of these functions are not required in implementing the present invention, and are provided here so that a complete disclosure of the environment in which the present invention operates may be more fully understood.

FIG. 10 more particularly illustrates the particular layout features of the sigma delta modulator 25 and particularly illustrates the arrangement of the integrating capacitors CI, sampling capacitors CS, and op amps 45 so as to isolate the analog circuitry from digital control signals which can distort the operation of the A/D converter 19b. The integrator circuits 40a, 40b are positioned between rows of longitudinally extending power and ground buses 80a, 80b and digital signal buses 81a, 81b so as to provide maximum spatial isolation of the analog circuits from digital circuits. Analog switches which comprise the MOSFETs M1+, M1−, M2+, M2−, M3+, M3−, and M4+, M4− are contained within the switch regions 82a, 82b, which are positioned between the power and ground buses 80a, 80b and the digital signal buses and clocks 81a, 81b.

Each of the power and ground buses 80a, 80b include signals, working from the inside out, VBIAS, AVSS, AVDD, AGND, −VR, +VR, and VINT. VBIAS is a biasing signal for the op amps 45a, 45b. AVSS and AVDD are power supply lines, while AGND is a ground line for the analog circuitry. −VR and +VR are reference voltages, while $V_{in+}$ and $V_{in-}$ are the differential analog input voltages.

The digital signal buses 81a, 81b comprise a two-phase clocking signal $\Phi 1$, $\Phi 2$, each of which has a period of 1/1.2288 MHz (about 815 nanoseconds) and is delayed by 4 nanoseconds as described in connection with FIG. 8 in order to obtain the four 1.2288 MHz four-phase clock signals $\Phi 1a$, $\Phi 1b$, $\Phi 2a$, $\Phi 2b$. The digital output signal is denominated DOUT.

Still referring to FIG. 10, it will be observed that the sampling capacitors CS1+, CS1− are positioned on the right-hand side of the chip (when viewing the chip as oriented as shown in FIG. 10), followed moving right to left by the integrating capacitors CI1+, CI1−, followed again moving to the left by the op amp 45a. It will be understood that all of these capacitor areas are formed in a common region on the chip for ease of fabrication. In a similar manner, the sampling capacitors CS2+, CS2− are positioned adjacent to the op amp 45a, moving right to left, followed next by the integrating capacitors CI2+, CI2−, followed by the op amp 45b. The output of the op amp 45b are the differential signals OUT+, OUT−, which are provided to the comparator 47 which is positioned further to the left (FIG. 110).

It should by now be understood that the symmetry of layout of the analog control signals VBIAS, AVSS, AVDD, AGMD, followed by the reference signals −VR, +VR, then followed moving outwardly by the differential analog input signal $V_{in+}$, $V_{in-}$ (FIG. 10) provides a symmetrical insulating and isolating region which separates the sensitive analog circuitry from the high speed digital clocks $\Phi 1a$, $\Phi 1b$, $\Phi 2a$, $\Phi 2b$ and other digital signal circuits, any of which can serve as a source of contamination of the analog signals. It will thus be understood and appreciated that this novel layout contributes to the extremely high signal-to-noise ratio which is provided by modems made in accordance with the preferred embodiment of the present invention.

DECIMATION FILTER

Before discussing the actual implementation of the preferred embodiment of the integrated FIR low pass decimating filter, comprising the low pass filter 26 and decimating filter 30 of FIGS. 3 and 4, the theory of operation will be provided. As discussed above, there are two stages of decimation used. The first stage 30a is described here, while the second stage 30b is a conventional IRR filter. The low pass filter 26 and decimating filter 30a in the preferred embodiment is a novel implementation of an FIR filter of length N, having N coefficients {$h_o, h_1, \ldots h_N$}, including a decimation stage. A generalized block diagram for such a filter 120 is shown in FIG. 11. The inputs of this filter are digital samples separated in time by T. Since decimation of an input data stream is required in the present invention, an output is only required after a multiple of k input sample periods, i.e., one output occurs for every k input samples. In FIG. 11, input signal x(nT) is sampled every T seconds, delayed by delay units 121 by $z^{-1}$, and multiplied by coefficients $h_i$ by multipliers 122. The outputs of the multipliers 122 are then summed by adder 123, and the output of the adder is sampled at the rate of 1/kT by a switch 124 for decimation to obtain the filtered output signal y(knT).

In the present invention, it will be understood that the input signal x(nT) takes on only the values ±1 or {0,1}, whichever is easier to handle. This means that the multiplication can be avoided entirely, so the equivalent filter expression may be stated as follows:

$$y(knT) = \sum_{i=1}^{N} h_i x((n-i)T) \qquad \text{(EQUATION 2)}$$

The generalized filter of FIG. 11 can be described in a way that takes advantage of the fact that the output is only calculated once for every k input samples, shown as filter 120' in FIG. 12. Basically, the input samples are shifted k times through the shift register comprising the delay units 121 between calculations of the output samples y(knT). To illustrate this, the transfer function of the filter 120 is divided into L separate subfilters 130, where L=N/k. L is forced to be an integer by adding zero coefficients to the original filter. An additional adder stage 131 is employed to add the outputs of the subfilters 130.

We can now use Tellegan's theorem to draw an equivalent block diagram of this filter 120'. Tellegan's theorem indicates that an equivalent filter can be built by reversing the direction of flow through the filter. An exemplary subfilter 130' of order k redrawn using this theorem is shown in FIG. 13, and can be represented by the equation:

$$W(nT) = \sum_{i=1}^{k} h_i x_{n-i} \qquad \text{(EQUATION 3)}$$

It will be appreciated that after application of Tellegan's theorem, the input signal x(nT) is multiplied by the coefficients $h_i$ in parallel, delayed by the delay units 121, and then added with the adders 123 to a delayed version of the previous stages.

It will be recalled that the output of this filter at an subfilter 130' is required at an interval of k input samples, because of the decimation function. Thus, a different subfilter structure 135 can be created that will calculate the output of the subfilter 130' only once for every k input samples as shown in FIG. 14. The coefficients $h_i$ are stored in a read only memory (ROM) 136, which sequentially provides the coefficients to a single multiplier stage 122'. An accumulator 137 comprising an adder 138 and delay unit 139 accumulates the sum of EQUATION 4. The subfilter 135 shown in FIG. 14 takes input samples at the input sample rate and, after accumulating k input samples multiplied by the filter coefficients $h_i$ in the accumulator 137, outputs a sample at the lower sample rate by sampling with the switch S1. When the output is sampled, the accumulator is cleared by switch S2 before the next k+1 samples are accumulated. Switch S3 selects the filter coefficients in the required order, and comprises a counter (not shown) for stepping through the addresses of the ROM 136.

The transfer function for the subfilter 135 of FIG. 14 may be expressed as:

$$w(knT) = \sum_{i=1}^{k} h_i x_{n-i} \qquad \text{(EQUATION 4)}$$

Note that if x(nT) is a 1 bit number representing {+1, −1}, then the multiplier can be constructed with a simple exclusive-OR gate. With this in mind, the filter 120'' employing a plurality of subfilters 135a, 135b, 135c may be redrawn as shown in FIG. 15, for L=3. Note that a delay of $Z^{-k}$ for k samples is required to match the delays in the path of x(nT), as observed in connection with FIG. 12.

Applying Tellegan's Theorem to the filter 120'' of FIG. 15, the filter 120''' of FIG. 16 is obtained. This is the final form of the preferred FIR decimating filter in terms of conventional block diagrams. The remainder of this description describes how this structure can be mapped into a form suitable for VLSI implementation.

Referring next to FIG. 17, which is an expanded version of FIG. 16, it will be noted that the delay $z^{-k}$ becomes a unit delay $z^{-1}$ if it is moved to the other side of the decimation switch S1. It will be appreciated that it is possible to multiplex the hardware of the subfilters 135 and use a single accumulator and multiplier instead of a separate accumulator and multiplier for each of the subfilters 135a, 135b, 135c. This requires the accumulator to operate L times faster than the input sample rate. The subfilter processes one input sample at a time at the input rate 1/T and produces one output sample at the decimated rate 1/kT. The subfilter accumulator only operates once for each input sample. When the hardware for L subfilters is multiplexed, the accumulator operates L times for each input sample.

FIG. 18 illustrates a preferred decimating FIR filter 150 which incorporates all of the concepts for construction described above in connection with FIGS. 11-17, for the case where L=4, and which is employed to construct the low pass filter 26 and decimating filter 30a in the preferred embodiment. It has been calculated that the transfer function for the filter required to reduce the 1.2288 MHz input signal by 32:1 to 38.4 kHz only requires 9 bit filter coefficients, but for ease of implementation a 16 bit ROM may be used. The filter 150 employs a one-bit latch 151a and sixteen-bit latches 151b, 151c, 151d, 151e as transparent means for implementing the $z^{-1}$ delay registers. The ROM 152 stores the coefficients $h_i$, and a seven bit counter 153 steps through the ROM addresses with a clock CLK having a rate of L/T. This clock may be considered a second clock compared to the frequency of the first or data input clock at 1/T. Since there are four subfilter stages in the preferred embodiment, L=4, so the second clock rate is (4) (1.2288 MHz)=4.9152 MHz.

It will be understood that the filter structure 150 of FIG. 18 is for the case where L=4. However, the structure is independent of L. Additional registers may be added to the shift register/latches 151 and the size of the ROM increased to accommodate larger values of L.

Latch 151a, labelled register $R_0$, holds the input sample x(nT) for L second clock periods. The multiplier 154 in this case comprises a set of exclusive-OR gates since x(nT) only takes on the values {0,1}. The ROM 152 preferably stores the subfilter coefficients, each of n bits, in an interleaved fashion. Alternatively, the coefficients can be stored in their original sequence as in the direct form FIR filter of FIG. 11. In the latter case, it will be understood that the coefficients can be interleaved by changing the address lines of the ROM.

Switch $S_2$ connects the output of register/latch $R_1$ to register/latch $R_2$ for all clock periods except when the output of $R_1$ is sampled on switch $S_1$. The clock period for switch $S_1$ is 1/kT, which is the decimation frequency. Accordingly, the $S_1$ frequency may be considered a third clock when compared to the first or data input clock at frequency 1/T. Every 1/kT or third clock period, $S_2$ connects all zeroes to clear the contents of $R_2$.

There are accordingly three types of clock cycles. The first type of clock, connected to the switch $S_4$, occurs consecutively for k−1 times, and is the input sample rate. The second type of clock, connected to the counter 153 and switch $S_3$, occurs for L(k−1) times. The third type of clock cycle, connected to switches $S_1$ and $S_2$, occurs on the kth occurrence of the first type of clock cycle. The third clock cycle type occurs with $S_3$ open, $S_1$ closed, and $S_2$ switched to reset register/latch $R_2$. $S_4$ is closed on every Lth second clock cycle and is coincident with the k−1th clock cycle. On each second clock cycle, the following operations occur simultaneously:

$R_1 \rightarrow X(n)h_i + R_4, R_4 \rightarrow R_3, R_3 \rightarrow R_2, R_2 \rightarrow R_1$ On the third type of clock cycle, the following occurs:
$R_1 \rightarrow R_1, R_2 \rightarrow O, R_3 \rightarrow R_3, R_4 \rightarrow R_4, Y(knT) = R_1$ After clock cycle 1 (of the second type of clock), $R_1$ will contain the accumulation for the first subfilter, $R_2$ will contain the accumulation for the second subfilter, and so on. After L cycles of the second clock, an additional iteration has occurred for each subfilter. This occurs for L.k clock cycles when the output of each subfilter is complete. At this point, the output of the first subfilter is sampled. During this cycle, no data is shifted between the remaining registers and the register/latch $R_2$ is cleared. This has the effect of implementing the $z^{-k}$ delay element of FIG. 17. The output from the last subfilter is moved to the accumulator of the next to last subfilter and so forth.

For purposes of the present invention, the conventional filter form of FIG. 11 would require 96 shift registers, 96 adders, and 96 multipliers. The preferred embodiment of FIG. 18 uses one 16 bit adder 155, four 15 bit register/latches, one multiplier (primarily exclusive-OR gates), and a ROM to store the coefficients. It will thus be appreciated that the general decimating filter 150 of FIG. 18 may be efficiently implemented with VLSI logic, and substantial savings of chip area are possible.

SIGMA DELTA D/A CONVERTER

Turn next to FIG. 19 for a description of the preferred sigma delta modulator based D/A converter 18. The preferred D/A converter 18 takes a 16 bit digital code at the rate of 9600 words per second from the modulator 17 (FIG. 1) and converts it into an analog signal for transmission by the hybrid circuit 20 over the telephone line 15. The D/A converter 18 comprises a first interpolator 161 which generates oversamples at the rate of 4:1 to obtain 38.4 kilosamples per second, by an interpolation process. A second 32:1 interpolator 162 takes the output of the first interpolator 161 and generates a 1.2288 megasamples per second, still of sixteen bits per sample. In general, interpolation by both interpolators 161, 162 is carried out in the manner described with respect to FIG. 10 of the paper by Candy et al., "A Voiceband Codec with Digital Filtering," *IEEE Trans. Commun.*, vol. COM-29, pp. 815-830, June 1981, referenced hereinabove.

The output of the interpolator 162 is provided to a digital sigma delta modulator 163, which is described in greater detail in connection with FIG. 20. The output of the sigma delta modulator 163 is provided to a return to zero digital to analog converter 165, and thence to an analog antialiasing filter 168, essentially a low pass filter. The return to zero digital to analog converter 165 and the analog antialiasing filter 168 are described in greater detail in connection with FIG. 21.

The sigma delta modulator 163 is constructed substantially as described in connection with FIG. 3 of the paper by Candy, "A Use of Double Integration in Sigma Delta Modulation," referenced above. A digital implementation of the sigma delta modulator 163 is shown in FIG. 20. The 1.2288 megasample per second input signal from the interpolator 162 is first provided to a sixteen bit adder 170 which corresponds to the outer feedback loop or first subtraction stage in the referenced Candy paper. The other operand for adder 170 is the two's complemented output of the circuit, provided on lines 171. A digital two's complement circuit 173 performs this function in the known manner, so that the adder 170 carries out a subtraction function for the negative feedback.

From the adder 170, the digital signal passes to a second adder 172, which corresponds to the first adder after the $G_2$ gain stage in the referenced Candy paper. The other operand to the adder 172 is the output of a first accumulator 174, which corresponds to the first delay in the referenced Candy paper. The accumulator 174 and adder 172 carry out the first level of integration in the double integration process.

It will be appreciated that no gain stages are required in the digital implementation of FIG. 20 inasmuch as there are no circuit imperfections in a digital implementation which might cause the loop gains to be other than unity. If any corrections are required, they can be easily implemented with the addition of offsets in the accumulators.

From the adder 172, the signal passes to a third adder 176, which corresponds to the inner loop or second subtraction stage in the referenced Candy paper. Accordingly, the other operand to the adder 176 is the two's complemented output on lines 171. From the adder 176 there is a fourth adder 178, which corresponds to the adder after the $G_1$ gain stage in the referenced Candy paper. The other operand to the adder 178 is the output of a second accumulator 179, which corresponds to the second delay in the referenced Candy paper. The accumulator 179 and adder 178 carry out the second level of integration in the double integration process.

The referenced Candy paper employs a quantizer as the final stage in the double integrator sigma delta modulator. In the preferred digital embodiment of FIG. 20, all that is required is to select the most significant bit (MSB) of the sixteen bit signal from the output of adder 178 in order to obtain a one bit quantizer. Thus, the output of the digital sigma delta modulator 163 is the MSB, denominated 1 BIT MODULATED CODE. This output is provided to a return-to-zero one bit D/A converter 165.

Turn now to FIG. 21 for a description of the return-to-zero 1 bit D/A converter 165 and analog antialiasing filter 168. The return-to-zero circuit 165 reduces distortion caused by unequal rise and fall times of the incoming signal, and the antialiasing or low pass filter 168 averages the sequences of return-to-zero corrected pulses so as to obtain a low pass filtered analog signal, and provides signal isolation and amplification.

The return-to-zero (RTZ) circuit 165 eliminates distortion induced by asymmetrical rise and fall times of the pulse output from the digital sigma delta modulator 163. The problem of non-equal rise and fall times has been addressed in the prior art by trying to use special CMOS drivers with matched P and N transistors and by using circuit techniques to achieve faster rise and fall times. It is believed that the mechanism that causes the distortion is the fact that the energy of adjacent pulses do not add linearly. The reason for nonlinear addition is believed to be due to the fact that rise and fall times of the pulses are not equal.

In the present invention, the problem is solved by a method of making adjacent pulses add linearly without requiring equal rise and fall times. The method entails making each pulse short enough so that it will not overlap in time with adjacent pulses. It is required that a given pulse falls to zero (including the fall time) before the next pulse starts.

The RTZ circuit 165 comprises a pair of series-connected D-type flip flops 181a, 181b which are clocked by the signal CONVERTER CLOCK, which occurs at the 1.2288 MHz system clock rate. Note that the reset (R) input of the flip flop 181b is connected through an inverter 182 to the CONVERTER CLOCK so that the flip flop is clear on the trailing edge of the clocking signal. The input signal 1 BIT MODULATED CODE is provided to the D input of flip flop 181a, and the Q output of this flip flop is connected to the D input of flip flop 181b. The Q output of the flip flop 181b is provided to the low pass filter 168. The output of the RTZ circuit 165 therefore comprises a 1.2288 MHz serial digital bit stream, each pulse having an identical width, which is suitable for provision to the digital low pass filter 168.

The return-to-zero function is provided in the circuit 165 by inverting the CONVERTER CLOCK through inverter 182. It will thus be appreciated that a "zero" provided as the input will propagate through both flip-flops 181a, 181b to the output as a zero. On the other hand, a "one" will appear after one propagation delay through flip-flop 181b, as clocked in by the CONVERTER CLOCK, and will then be "returned to zero" when the positive edge of the CONVERTER CLOCK has propagated through the inverter 182 and reset the flip-flop 181b. Accordingly, it will be appreciated that each pulse from the digital sigma delta modulator 163 which represents a "one" should be short enough so that it will not under any circumstances overlap in time with an adjacent "one". Each "one" will be separated by at least the time of the CONVERTER CLOCK. Thus, it will be appreciated that a given pulse which represents a one falls to a zero before the next pulse starts.

The return-to-zero (RTZ) circuit 165 therefore makes sure that for every bit of the incoming signal 1 BIT MODULATED CODE the output signal returns to zero, whether a "one" or "zero", by splitting up into two phases. In the first phase the value of the bit is represented, whether "one" or "zero", and in the second phase the signal returns to zero. Thus, the net energy represented by a "one" is always the same, and the net energy represented by a zero is always the same. This solves the problem which occurs in prior art converter circuits wherein the energy contained in a "one" is different from that in a "zero", so the rise and fall times of a "one" and a "zero" are different. Anytime there is a signal with mismatched rise and fall times there is the potential for distortion.

It will also be understood by those skilled in the art that the problem of non-equal rise and fall times plagues other types of D/A converters. In the prior art references, "A3 μm CMOS Digital Codec With Programmable Echo Cancellation and Gain Setting", Paul Defraeye, IEEE J. SOLID-STATE CIRCUITS, Vol. SC-20, No. 3, June 1985 "Design and Implementation of an Audio 18-Bit Analog to Digital Converter using Oversampling Techniques", Robert W. Adams, J. AUDIO ENG. SOC., Vol. 34, No. 3, Mar. 1986, the problem of non-equal rise and fall times was described in connection with noise shaping oversampling A/D converters. Accordingly, it will be appreciated that the return-to-zero circuit 165 may find usefulness in circuits other than sigma delta modulators, for example, pulse-width modulation coders, interpolating coders, delta modulation coders, and noise shaping coders. In fact, such a return-to-zero approach can provide additional improvement in signal-to-distortion ratio on the order of 60 dB or better in many applications.

The analog antialiasing filter 168 is a conventional low pass active filter having essentially unity gain constructed around an operational amplifier 185, with resistors R all having a value of 10k ohms, and capacitor C having a value of 1000 pF. The output of the filter 168 is the signal ANALOG OUT, which is provided to the telco hybrid circuit 20 (FIG. 1).

The preferred embodiments of the present invention have been disclosed by way of example and it will be understood that other modifications may occur to those skilled in the art without departing from the scope and the spirit of the appended claims.

What is claimed is:

1. An improved analog front end circuit for a modem, comprising:

oversampling sigma delta modulator analog-to-digital converter means for converting an incoming analog signal into a plurality of digital signal samples and for shifting quantization noise out of the baseband of said incoming analog signal;

low pass filter means for filtering said quantization noise from said digital signal samples;

decimator means for reducing the number of said digital signal samples provided from said low pass filter means to provide a digital output signal having a predetermined signal rate less than the rate of said digital signal samples; and means for eliminating signal-dependent charges in said sigma delta modulator analog-to-digital converter means.

2. The improved analog front end circuit of claim 1, wherein said sigma delta modulator comprises MOSFET switching means, and wherein said charge eliminating means comprises:

means for storing a sample of said incoming signal;

means for integrating said incoming signal;

means for switching on a first transistor and a second transistor in said MOSFET switching means at a predetermined time to sample said incoming signal on said sample storing means;

means for switching off said second transistor prior to switching off said first transistor so that an incoming signal-independent charge is injected into said sample storing means and a source circuit for said incoming signal, thereby causing voltage offset but no incoming signal-dependent distortion;

means for switching off said first transistor subsequent to switching off said second transistor so that an incoming signal-dependent charge is returned to the source circuit for said incoming signal;

means for switching on a third transistor and a fourth transistor in said MOSFET switching means at a second predetermined time to transfer the charge on said sample storing means to said integrating means;

means for switching off said fourth transistor prior to said third transistor so that an incoming signal-independent charge is injected into said sample storing means and said integrating means, thereby causing voltage offset but no incoming signal-dependent distortion; and means for switching off said third transistor subsequent to switching off said fourth transistor so that an incoming signal-dependent charge in said third transistor is returned to ground.

3. The improved analog front end circuit of claim 1, wherein said analog-to-digital converter comprises a one-bit converter.

4. The improved analog front end circuit of claim 1, wherein said sigma delta modulator analog-to-digital converter means comprises differential circuit means.

5. The improved analog front end circuit of claim 1, wherein said analog-to-digital converter comprises at least one switched capacitor integrator means.

6. The improved analog front end circuit of claim 5, wherein said switched capacitor integrator comprises a four phase clocked MOSFET switched capacitor integrator.

7. The improved analog front end circuit of claim 6, wherein said four phase clocked MOSFET switched capacitor integrator comprises:

an integrator circuit comprising an integrator input, an integrator output, and an integrating capacitor connected between said integrator output and said integrator input;

an input signal sampling capacitor;

a first MOS switching means operative to connect ground to a first plate of said sampling capacitor at a first clock time;

a second MOS switching means operative to switch said incoming analog signal to a second plate of said sampling capacitor at a second clock time subsequent to said first clock time;

a third MOS switching means operative to connect said first plate of said sampling capacitor to said integrator circuit input at a third clock time subsequent to said second clock time; and a fourth MOS switching means operative to connect ground to said second plate of said sampling capacitor at a fourth clock time subsequent to said third clock time for discharging said sampling capacitor.

8. A one bit digital to analog converter for converting a one bit pulse code modulated digital input signal into an analog output signal, comprising:

return-to-zero means for reducing distortion in said analog output signal caused by unequal energies in signals representing a zero and signals representing a one in said one bit digital input signal and for providing a corrected modulated digital signal; and low pass filter means for converting said corrected modulated digital signal into said analog output signal.

9. The digital to analog converter of claim 8, wherein said return-to-zero means comprises a first latching circuit for storing the state of said digital input signal on a leading edge of a clock signal, a second latching circuit for storing the output of said first latching circuit on the next subsequent occurrence of said clock signal, the output of said second latching circuit corresponding to the output of said return-to-zero means, and reset means for resetting said second latching circuit to an initial condition prior to the next digital input signal.

10. An improved low distortion four phase clocked integrator circuit for integrating an input signal, comprising:

integrating means:

an input signal sampling capacitor;

a first switching means operative to connect ground to a first plate of said sampling capacitor at a first time;

a second switching means operative to switch said input signal to a second plate of said sampling capacitor at a second time to sample said input signal;

a third switching means operative to connect said first plate of said sampling capacitor to said integrating means at a third time; and a fourth switching means operative to connect ground to said second plate of said sampling capacitor at a fourth time; and timing means for controlling the timing of said first time, said second time, said third time, and said fourth time to control the sampling of said input signal and the transfer of charge from said sampling capacitor to said integrating means such that signal dependent charges associated with said switching means are not transferred to said integrating means.

11. The integrator circuit of claim 10, wherein said second time is subsequent to said first time, said third time is subsequent to said second time, said fourth time is subsequent to said third time, and a subsequent occurrence of said first time is subsequent to said fourth time.

12. The integrator circuit of claim 10, wherein said integrating means comprises operational amplifier means and an integrating capacitor connected between an input of said amplifier means and an output of said amplifier means.

13. The integrator circuit of claim 10, wherein said integrating means comprises an inverting integrator input, a noninverting integrator input, an inverting integrator output, and a noninverting integrator output, a first integrator capacitor connected between said noninverting integrator output and said inverting integrator input and a second integrating capacitor connected between said inverting integrator output and said noninverting integrator input.

14. The integrator circuit of claim 10, wherein said input signal sampling capacitor is a first input signal sampling capacitor;

said input signal comprises a first input signal and a differentially inverted second input signal;

said first switching means is a first first switching means;

said second switching means is a first second switching means;

said third switching means is a first third switching means;

said fourth switching means is a first fourth switching means; and further comprising:

a second first switching means operative to connect ground to a first plate of said second sampling capacitor at said first time;

a second second switching means operative to switch said second input signal to a second plate of said second sampling capacitor at said second time;

a second third switching means operative to connect said first plate of said second sampling capacitor to said noninverting integrator circuit input at said third time; and a second fourth switching means operative to connect ground to said second plate of said second sampling capacitor at said fourth time.

15. The integrator circuit of claim 10, wherein said switching means comprises MOSFETs.

16. An improved integrator circuit for integrating an input signal, comprising:

an integrator circuit comprising an integrator input, an integrator output, and an integrating capacitor connected between said integrator output and said integrator input;

an input signal sampling capacitor;

first switching means for connecting said input signal to said sampling capacitor;

second switching means for connecting said sampling capacitor to said integrator input; and timing means for controlling the times of switching by said first and said second switching means such that distortion of said input signal due to signal dependent charge injection is substantially reduced.

17. An improved analog-to-digital converter, comprising:

a sigma delta modulator for converting said incoming analog signal into a bit stream of digital samples at a predetermined rate of oversampling comprising MOSFET switching means;

a low pass digital filter responsive to said bit stream of digital samples for filtering quantization noise from said bit stream;

a decimator connected to the output of said low pass digital filter for reducing the number of said digital samples; and means for eliminating signal-dependent charges in said MOSFET switching means of said sigma delta modulator.

18. A sigma delta modulator based digital to analog converter for converting an input digital signal into an analog output signal, comprising:

oversampling means for converting said input digital signal into an oversampled digital signal;

sigma delta modulator means responsive to said oversampled digital signal for shifting quantization noise out of the baseband of said input digital signal and for providing a one-bit pulse code modulated signal;

one-bit digital to analog converter means for converting said one-bit pulse code modulated signal into said analog output signal; and return-to-zero means for reducing distortion in said one-bit digital to analog converter means due to unequal rise and fall times of said one-bit pulse code modulated signal.

19. The sigma delta modulator based digital to analog converter of claim 18, wherein said oversampling means comprises a digital interpolator.

20. The sigma delta modulator based digital to analog converter of claim 18, wherein said sigma delta modulator means comprises a digital integrator, and feedback means for feeding back the output of said digital integrator to the input of said digital integrator.

21. The sigma delta modulator based digital to analog converter of claim 18, wherein said return-to-zero means comprises a first latching circuit for storing the state of said digital input signal on a leading edge of a clock signal, a second latching circuit for storing the output of said first latching circuit on the next subsequent occurrence of said clock signal, the output of said second latching circuit corresponding to the output of said return-to-zero means, and reset means for resetting said second latching circuit to an initial condition prior to the next digital input signal.

22. A multistage digital filter for filtering a serial digital input signal, comprising:

addressable memory means for storing in an interleaving fashion a plurality of filter coefficients in addressable locations for L subfilter stages, where L is an integer, and where for each of said L stages there are k subfilter coefficients, where k is an integer;

means for retrieving said plurality of filter coefficients in a predetermined sequence during a first clock cycle;

means for receiving said serial digital input signal at a rate corresponding to a second clock cycle, said second clock cycle being longer than said first clock cycle;

means for forming a sum of partial products of said plurality of filter coefficients and said digital input signal for a time period corresponding to a third clock cycle, said third clock cycle corresponding to a decimation frequency;

a plurality of L cascaded registers for storing a plurality of L accumulated partial products;

means for summing said partial product sum with a feedback value stored in the Lth register to obtain an accumulated partial product; and means for sampling the contents of one of said L cascaded registers to provide a filtered output signal.

23. The filter of claim 22, wherein said digital input signal is provided at an input frequency of 1/T, wherein said decimation frequency is 1/kT, and wherein said retrieving means retrieves said k subfilter coefficients for each of said L subfilter stages during a time period kT.

24. The filter of claim 23, wherein said forming means comprises:

multiplier means for multiplying a retrieved one of said filter coefficients for each of said L subfilter stages with said digital input signal to obtain said partial product.

25. A digital decimating filter having L subfilter stages, where L is an integer, for filtering a serial input signal $x_n$ provided at an input rate of 1/T to provide a filtered output signal at a decimated rate 1/kT, where k is an integer, comprising:

addressable memory means for storing a plurality N of n bit filter coefficients h in addressable locations, there being k filter coefficients for each of said L subfilter stages such that L·k=N, where n and N are integers;

means for retrieving said plurality of filter coefficients in a predetermined sequence during a first clock cycle, said first clock cycle occurring at a frequency of L/T;

means for receiving said serial digital input signal $x_n$ at a rate corresponding to said input rate;

an input register for storing said digital input signal for a period of time T;

means for retrieving the ith one $h_i$ of said k filter coefficients for each of said L subfilter stages from said memory means during said period of time T;

multiplier means for multiplying said retrieved one $h_i$ of said filter coefficients for each of said L subfilter stages with said digital input signal x to obtain a partial product $h_i x_n$;

a plurality of L cascaded registers for storing a plurality of L accumulated partial products for a period of time kT;

means for summing said partial product $h_i x$ with the value stored in the Lth register to obtain an accumulated partial product $x_n h_i + x_n - L$; and output means for providing said accumulated partial product $x_n h_i + x_n - L^{h_i} - L$ as said filtered output signal by sampling the contents of one of said L cascaded registers at said decimation rate 1/kT.

26. The filter of claim 24, wherein said multiplier means comprises a complementer.

27. The filter of claim 22, wherein said filter is a finite impulse response (FIR) filter.

28. An improved analog-to-digital converter, comprising:

oversampling sigma delta modulator analog-to-digital converter means for converting an incoming analog signal into a plurality of digital signal samples and for shifting quantization noise out of the baseband of said incoming analog signal; and an L-stage digital finite impulse response low pass decimating filter, where L is an integer, for filtering said quantization noise from said digital signal samples, comprising:

addressable memory means for interleavingly storing a plurality of k filter coefficients for each of said L stages in addressable locations, means for retrieving said plurality of filter coefficients in a predetermined sequence during a first clock cycle, means for receiving said digital signal samples at a rate corresponding to a second clock cycle, said second clock cycle being longer than said first clock cycle, means for forming a sum of partial products of said plurality of filter coefficients and said digital signal samples for a time period corresponding to a third clock cycle, said third clock cycle corresponding to a first decimation frequency, a plurality of L cascaded registers for storing a plurality of L accumulated partial products, means for summing said partial product sum with a feedback value stored in the Lth register to obtain an accumulated partial product, and means for sampling the contents of said accumulator means to provide a filtered output signal at said first decimation frequency.

29. The analog-to-digital converter of claim 28, further comprising second decimator means for reducing the number of said digital signal samples provided as said filtered output signal to provide a decimated digital output signal at a second decimation frequency lower than said first decimation frequency.

30. The analog-to-digital converter of claim 28, wherein said accumulator means comprises:

a plurality of L cascaded registers for storing a plurality of L accumulated partial products for a time period kT; and means for summing said partial product with a feedback value stored in the Lth register to obtain an accumulated partial product, and wherein said sampling means for provides said accumulated partial product stored in one of said L registers as said digital output signal.

31. The analog-to-digital converter of claim 28, wherein said converter is employed as an analog front end circuit for a modem.

32. An improved analog to digital converter, comprising:

oversampling sigma delta modulator analog-to-digital converter means for converting an incoming analog signal into a plurality of digital signal samples and for shifting quantization noise out of the baseband of said incoming analog signal, said analog-to-digital converter comprising at least one four phase clocked MOSFET switched capacitor integrator means;

low pass filter means for filtering said quantization noise from said digital signal samples;

decimator means for reducing the number of said digital signal samples provided from said low pass filter means to provide a digital output signal having a predetermined signal rate less than the rate of said digital signal samples.

33. The analog to digital converter of claim 32, wherein said converter is employed as an analog front end circuit for a modem.

34. The analog to digital converter of claim 32, further comprising means for eliminating signal-dependent charges in said MOSFET switched capacitor integrator.

35. The analog to digital converter of claim 34, wherein said charge eliminating means comprises:

means for switching on a first transistor and a second transistor in said MOSFET switched capacitor integrator at a predetermined time to sample said incoming signal on said sample storing means;

means for switching off said second transistor prior to switching off said first transistor so that an incoming signal-independent charge is injected into a sample storing means and a source circuit for said incoming signal, thereby causing voltage offset but no incoming signal-dependent distortion;

means for switching off said first transistor subsequent to switching off said second transistor so that an incoming signal-dependent charge is returned to the source circuit for said incoming signal;

means for switching on a third transistor and a fourth transistor in said MOSFET switched capacitor integrator at a second predetermined time to transfer the charge on said sample storing means to an integrating means;

means for switching off said fourth transistor prior to said third transistor so that an incoming signal-independent charge is injected into said sample storing means and said integrating means, thereby causing voltage offset but no incoming signal-dependent distortion; and means for switching off said third transistor subsequent to switching off said fourth transistor so that an incoming signal-dependent charge in said third transistor is returned to ground.

36. The analog to digital converter of claim 32, wherein said four phase clocked MOSFET switched capacitor integrator comprises:

an integrator circuit comprising an integrator input, an integrator output, and an integrating capacitor connected between said integrator output and said integrator input;

an input signal sampling capacitor;

a first MOS switching means operative to connect ground to a first plate of said sampling capacitor at a first clock time;

a second MOS switching means operative to switch said incoming analog signal to a second plate of said sampling capacitor at a second clock time subsequent to said first clock time;

a third MOS switching means operative to connect said first plate of said sampling capacitor to said integrator circuit input at a third clock time subsequent to said second clock time; and a fourth MOS switching means operative to connect ground to said second plate of said sampling capacitor at a fourth clock time subsequent to said third clock time for discharging said sampling capacitor.

37. An L-stage digital filter, where L is an integer, for filtering a serial digital input signal, comprising:

memory means for interleavingly storing a plurality of k subfilter coefficients for each of L subfilter stages in addressable locations, where k is an integer;

means for addressing said memory means at a clock rate of L/T, where T is the sampling period to retrieve said filter coefficients;

means for complementing a retrieved one of said filter coefficients in response to said serial digital input signal to provide a partial product of said serial digital input signal and said retrieved filter coefficient;

a plurality of L cascaded registers for storing a plurality of L accumulated partial products for a time period kT; and means for summing said partial product with a feedback value stored in the Lth register to obtain an accumulated partial product, and means for providing said accumulated partial product stored in one of said L registers as a digital output signal.

38. The integrator circuit of claim 16, wherein said first switching means comprises a first means operative to connect ground to a first plate of said sampling capacitor at a first time, and a second means operative to switch said input signal to a second plate of said sampling capacitor at a second time to sample said input signal, wherein said second switching means comprises a third means operative to connect said first plate of said sampling capacitor to said integrator circuit at a third time, and a fourth means operative to connect ground to said second plate of said sampling capacitor at a fourth time, and wherein said timing means is operative for controlling the timing of said first time, said second time, said third time, and said fourth time to control the sampling of said input signal and the transfer of charge from said sampling capacitor to said integrator circuit such that signal dependent charges associated with said switching means are not transferred to said integrator circuit.

39. The digital to analog converter of claim 18, wherein said oversampling means comprises a digital interpolator.

* * * * *